United States Patent
Koenenkamp et al.

(10) Patent No.: US 10,637,492 B2
(45) Date of Patent: Apr. 28, 2020

(54) ANALOGUE-TO-DIGITAL CONVERTER CIRCUITRY EMPLOYING AN ALIGNMENT SIGNAL

(71) Applicant: SOCIONEXT INC., Yokohama-shi, Kanagawa (JP)

(72) Inventors: Ingo Koenenkamp, Braunschweig (DE); Niklas Linkewitsch, Braunschweig (DE)

(73) Assignee: SOCIONEXT, INC, Yokohama (JP)

( * ) Notice: Subject to any disclaimer, the term of this patent is extended or adjusted under 35 U.S.C. 154(b) by 0 days.

(21) Appl. No.: 16/244,000

(22) Filed: Jan. 9, 2019

(65) Prior Publication Data
US 2019/0229742 A1 Jul. 25, 2019

(30) Foreign Application Priority Data
Jan. 19, 2018 (EP) ..................................... 18152583

(51) Int. Cl.
*H03M 1/10* (2006.01)
*H03M 1/06* (2006.01)
*H03M 1/12* (2006.01)

(52) U.S. Cl.
CPC ....... *H03M 1/1009* (2013.01); *H03M 1/0624* (2013.01); *H03M 1/1215* (2013.01)

(58) Field of Classification Search
CPC .................................................. H03M 1/009
USPC ................................ 341/155, 120, 118, 159
See application file for complete search history.

(56) References Cited

U.S. PATENT DOCUMENTS

| | | | | |
|---|---|---|---|---|
| 5,120,997 A * | 6/1992 | Cantwell | ................ | H04K 3/228 |
| | | | | 327/50 |
| 8,791,845 B2 | 7/2014 | Nandi et al. | | |
| 2009/0322578 A1* | 12/2009 | Petrovic | ............... | H04B 1/0039 |
| | | | | 341/155 |
| 2010/0178065 A1* | 7/2010 | Nishihara | .............. | H04B 10/61 |
| | | | | 398/202 |

FOREIGN PATENT DOCUMENTS

WO WO 2008/142486 A1 11/2008
WO WO 2018/006972 A1 1/2018

OTHER PUBLICATIONS

Extended European Search Report, European Patent Application No. 18152583.3, dated Jul. 13, 2018.

* cited by examiner

*Primary Examiner* — Peguy Jean Pierre
(74) *Attorney, Agent, or Firm* — Arent Fox, LLP

(57) ABSTRACT

The present invention relates to analogue-to-digital converter circuitry, and in particular to alignment between one set of analogue-to-digital circuitry and another set. Such sets may be referred to as converter channels.

17 Claims, 12 Drawing Sheets

ANALOGUE-TO-DIGITAL CONVERTER CIRCUITRY EMPLOYING AN ALIGNMENT SIGNAL

CROSS-REFERENCE TO RELATED APPLICATION

This application claims priority from European Patent Application No. 18152583.3 Jan. 19, 2018. The entire contents of the prior application are incorporated herein by reference.

The present invention relates to analogue-to-digital converter circuitry, and in particular to alignment between one set of analogue-to-digital circuitry and another set. Such sets may be referred to as converter channels for simplicity.

Architectures for realising analogue-to-digital converters (ADCs) generally fall into one of three categories, namely low-to-medium speed (e.g. integrating and oversampling ADCs), medium speed (e.g. algorithmic ADCs) and high speed (e.g. time-interleaved ADCs).

The main idea behind time-interleaved ADCs is to obtain very-high-speed analogue-to-digital conversion by operating many sub-ADC units (circuits) in parallel. By way of background, FIG. 1 is a schematic diagram of previously-considered analogue-to-digital converter circuitry 10. Such circuitry is explained in full detail in EP2211468, the entire contents of which are incorporated herein by reference. Circuitry 10 comprises sampler 12, voltage-controlled oscillator (VCO) 14, demultiplexers 16, ADC banks 18, digital unit 20 and calibration unit 22.

The sampler 12 is configured to perform four-way or four-phase time-interleaving so as to split the input current $I_{IN}$ into four time-interleaved sample streams A to D. For this purpose, VCO 14 is a quadrature VCO operable to output four clock signals 90° out of phase with one another, for example as four raised cosine signals. VCO 14 may for example be a shared 14 GHz quadrature VCO to enable circuitry 10 to have an overall sample rate of 56 GS/s.

Each of streams A to D comprises a demultiplexer 16 and an ADC bank 18 of sub-ADC units connected together in series as shown in FIG. 1. This sampler 12 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 56 GS/s, each of the streams A to D may have a 14 GS/s sample rate.

Focusing on stream A by way of example, the stream of current pulses is first demultiplexed by an n-way demultiplexer 16. Demultiplexer 16 is a current-steering demultiplexer and this performs a similar function to sampler 12, splitting stream A into n time-interleaved streams each having a sample rate equal to ¼n of the overall sample rate. Continuing the example overall sample rate of 56 GS/s, the n output streams from demultiplexer 16 may each have a 14/n GS/s sample rate. If n were to be 80 or 160 for example, the output streams of demultiplexer 16 may have a 175 MS/s or 87.5 MS/s sample rate, respectively. Demultiplexer 16 may perform the 1:n demultiplexing in a single stage, or in a series of stages. For example, in the case of n=80, demultiplexer 16 may perform the 1:n demultiplexing by means of a first 1:8 stage followed by a second 1:10 stage.

The n streams output from demultiplexer 16 pass into ADC bank 18, which contains n sub-ADC units each operable to convert its incoming pulse stream into digital signals, for example into 8-bit digital values. Accordingly, n digital streams pass from ADC bank 18 to digital unit 20. In the case of n=80, the conversion rate for the sub-ADC units may be 320 times slower than the overall sample rate.

Streams B, C, and D operate analogously to stream A, and accordingly duplicate description is omitted. In the above case of n=80, circuitry 10 may be considered to comprise 320 ADC sub-units split between the four ADC banks 18.

The four sets of n digital streams are thus input to the digital unit 20 which multiplexes those streams to produce a single digital output signal representative of the analogue input signal, current $I_{IN}$. This notion of producing a single digital output may be true schematically, however in a practical implementation it may be preferable to output the digital output signals from the ADC banks in parallel, and indeed this will be explored later herein in relation to the present invention.

Calibration unit 22 is connected to receive a signal or signals from the digital unit 20 and, based on that signal, to determine control signals to be applied to one or more of the sampler 12, VCO 14, demultiplexers 16 and ADC banks 18. It is preferable, as explained in EP2211468, to carry out calibration on the sampler 12, which is why the output from calibration unit 22 to the sampler 12 is shown as a solid arrow in FIG. 1, rather than as a dashed arrow.

FIG. 2 is a schematic circuit diagram of four-phase (i.e. multiphase) current-mode (current-steering) sampler 12. Although in FIG. 1 a single-ended input signal, current $I_{IN}$, is shown, it will be appreciated that a differential input signal could be employed, for example to take advantage of common-mode interference rejection. Accordingly, the sampler 12 and demultiplexers 16 and ADC banks 18 could be effectively duplicated in circuitry 10 to support such differential signaling, however such duplication is omitted from FIG. 1 for simplicity. Returning to FIG. 2, sampler 12 is configured to receive such a differential input current signal, modeled here as a current source $I_{IN}$ whose magnitude varies with the input signal.

Because of the differential signaling, sampler 12 effectively has two matching (or corresponding or complementary) sections 24 and 26 for the two differential inputs. Accordingly, there is a first set of output streams $IOUT_A$ to $IOUT_D$ in section 24 and a second set of matching output streams $IOUTB_A$ to $IOUTB_D$, where IOUTB means $\overline{IOUT}$, and wherein $IOUT_A$ is paired with $IOUTB_A$, $IOUT_B$ is paired with $IOUTB_B$, and so on and so forth.

Focusing on the first section 24 by way of example (because the second section 26 operates analogously to the first section 24), there are provided four n-channel MOSFETs $28_A$ to $28_D$ (i.e. one per stream or path) with their source terminals connected together at a common tail node 30.

The aforementioned current source $I_{IN}$ is connected between common tail node 30 and an equivalent common tail node 36 of section 26. A further current source $I_{DC}$ 32 is connected between the common tail node 30 and ground supply, and carries a constant DC current $I_{DC}$. The gate terminals of the four transistors $28_A$ to $28_D$ are driven by the four clock signals $\theta_0$ to $\theta_3$, respectively, provided from the VCO 24.

As mentioned above, section 26 is structurally similar to section 24 and thus comprises transistors $34_A$ to $34_D$, common tail node 36 and current source $I_{DC}$ 38.

FIG. 3 shows schematic waveforms for the clock signals $\theta_0$ to $\theta_3$ in the upper graph, and schematic waveforms for the corresponding output currents $IOUT_A$ to $IOUT_D$ in the lower graph.

The clock signals $\theta_0$ to $\theta_3$ are time-interleaved raised cosine waveforms provided as four voltage waveforms from the VCO 44. The use of four clock signals in the present case is due to the four-way-interleaving design of ADC circuitry 10, but it will be appreciated that, two or more time-interleaved clock signals could be used, for a two-or-more-way split of the input current signal.

Clock signals $\theta_0$ to $\theta_3$ are 90° out of phase with one another, such that $\theta_0$ is at 0° phase, $\theta_1$ is at 90° phase, $\theta_2$ is at 180° phase, and $\theta_3$ is at 270° phase.

The effect of sampling circuitry 12, under control of clock signals $\theta_0$ to $\theta_3$, is that the output currents $IOUT_A$ to $IOUT_D$ are four trains (or streams) of current pulses, the series of pulses in each train having the same period as one of the clock signals $\theta_0$ to $\theta_3$, and the pulses of all four trains together being time-interleaved with one another as an effective overall train of pulses at a quarter of the period of one of the clock signals (or at four times the sampling frequency of one of the clock signals).

FIG. 4 is a schematic circuit diagram of parts of ADC circuitry 10 useful for understanding the structure and operation of the demultiplexers 16. For simplicity, only part of the sampler circuitry 12 is shown. That is, only the "plus" section 24 is shown, and elements of that "plus" section 24 are omitted to avoid over-complicating FIG. 4.

Regarding the demultiplexers 16, only the demultiplexing circuitry 16 for output $IOUT_A$ is shown. Similar circuitry may also be provided for the other seven outputs $IOUT_B$ to $IOUT_D$, and $IOUTB_A$ to $IOUTB_D$.

As shown in FIG. 4, demultiplexers 16 in the present arrangement are formed of two stages, namely stages 16A and 16B. The first stage 46A performs 1:N demultiplexing, and the second stage 16B performs 1:M demultiplexing.

Stages 16A and 16B generally have the same structure as the array of sampling switches of the sampling circuitry 12 shown in FIG. 2 and denoted here by box 40. That is, each stage comprises a plurality of transistors (in this case, n-channel MOSFETs) whose source terminals are connected together at a common tail node.

From the above description of sampling the circuitry 12, and considering only the "plus" section 24 by way of example, it will be appreciated that the circuitry splits the input current $I_{IN}$ into X time-interleaved trains of pulses, where X=4 in the present arrangement. In the present arrangement, those pulse trains are provided at outputs $IOUT_A$ to $IOUT_D$. Sampling circuitry 12 can thus be thought of as performing a 1:X demultiplexing function. In the same way, each output from sampler 12 can be further 1:N demultiplexed by a stage 16A, and each output of a stage 16A can be further 1:M demultiplexed by a stage 16B.

Only one complete demultiplexed path is shown in FIG. 4. That is, input current $I_{IN}$ is demultiplexed to provide X (X=4 in the present case) outputs $IOUT_A$ to $IOUT_D$. Each of those outputs is then 1:N demultiplexed by a stage 16A, however this is only shown in FIG. 4 in respect of the left-most output $IOUT_A$. Consequently, the outputs from that shown stage 16A are outputs $IOUT_{A10}$ to $IOUT_{A1(N-1)}$. Each of those outputs (for all stages 16A) is then 1:M demultiplexed by a stage 16B, however this is again only shown in FIG. 4 in respect of the left-most output $IOUT_{A10}$. Consequently, the outputs from that shown stage 16B are outputs $IOUT_{A1020}$ to $IOUT_{A102(M-1)}$. Corresponding outputs are produced by the other stages 16B.

The sampling circuitry 12 and demultiplexers 16 together carry out a 1:Z demultiplexing function, where Z=X×N×M. In the present arrangement, X=4, N=8 and M=10. Thus, the present arrangement performs 1:320 demultiplexing, which leads to 320 outputs on the "plus" side 24 and a corresponding 320 outputs on the "minus" side 26.

FIG. 5 is a schematic diagram useful for understanding further the operation of demultiplexers 46. The uppermost trace shows a pulse train at output $IOUT_A$ of the sampling circuitry 42, and the traces below represent corresponding pulse trains of outputs $IOUT_{A10}$ to $IOUT_{A1(N-1)}$ (only $IOUT_{A10}$ to $IOUT_{A13}$ are shown) of a stage 46A. As can be appreciated from FIG. 5, pulse train $IOUT_A$ is effectively split up into N pulse trains each at 1/N the sample rate of pulse train $IOUT_A$.

Looking back to FIG. 1, the output signals from demultiplexers 16 pass into ADC banks 18. ADC banks 18 are used to produce digital values corresponding to the areas of the respective current pulses input thereto.

FIG. 6 is a schematic diagram useful for understanding the principle of operation of ADC banks 18. For simplicity, only one output, $IOUT_{A1020}$, of demultiplexers 16 is shown, and consequently the ADC circuitry 18 shown represents only the ADC circuitry required for that particular output, and could be referred to as part of a sub-ADC unit. Similar ADC circuitry 18 may be provided for all the outputs of the demultiplexers 16.

ADC circuitry 18 generally takes the form of a capacitance 50. As shown in FIG. 6, capacitance 50 may be variable in value, such that its value can be trimmed during calibration or during an initial setup phase. Generally speaking, capacitance 50 is employed to convert the current pulses from output $IOUT_{A1020}$ into voltage values $V_{OUT}$. That is, each pulse charges up capacitance 50 to a voltage proportional to the area of the pulse concerned. This is because the amount of charge in each current pulse is defined by its area (Q=∫I dt), and because the voltage across the capacitance 50 is defined by that amount of charge Q and the capacitance value C (V=Q/C).

The voltage $V_{OUT}$ for a particular pulse is held across capacitance 50 until the circuitry 18 is reset by reset switch 52. Whilst the voltage $V_{OUT}$ for a particular pulse is held, this analog output value can be converted into a digital output value, for example using an ADC circuit (sub-ADC unit) employing a successive-approximation register (SAR). In the case of differential circuitry, as in the present embodiment, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 54 and 56 of the same current pulse are shown in FIG. 6. The first pulse 54 represents a case in which minimal delay is experienced. The second pulse 56 represents a case in which some delay is experienced, for example due to track capacitance in the circuitry. Consequently, pulse 56 is stretched in time as compared to pulse 54. Importantly, the area of the two pulses 54 and 56 is substantially the same, and thus the output voltage $V_{OUT}$ would be the same for both.

FIG. 7 is a schematic diagram useful for understanding a possible application of SAR—ADC (Successive Approximation Register—Analogue-to-Digital Conversion) circuitry to circuitry 18 in FIG. 6. Such circuitry could have a cycle of phases of the form: Reset (R); Sample (S); 1; 2; 3; 4; 5; 6; 7 and 8, as shown in FIG. 7. In each Sample phase, a current pulse concerned may be converted into an output voltage $V_{OUT}$, and subsequently that voltage $V_{OUT}$ may be turned into an 8-bit digital value over the following 8 SAR stages. The next Reset stage then prepares the circuitry for the next current pulse.

FIG. 8 is a schematic diagram useful for understanding a possible layout for ADC circuitry 10. Only certain parts of circuitry 10 are shown for simplicity. As can be seen from FIG. 8, and assuming that X=4, N=8 and M=10, the sampler 12 has four outputs to four demultiplexer first stages 16A. Each demultiplexer stage 16A has 8 outputs (this is only shown for the uppermost demultiplexer first stage 16A) to 8 demultiplexer second stages 16B (only one of the 8 demultiplexer second stages 16B is shown, being for the lowermost output of the uppermost demultiplexer first stage 16A). Each demultiplexer second stage 16B has 10 outputs each to its own ADC. In the way shown in FIG. 8, it is possible to distribute the switches of the demultiplexer second stages 16B so that they are close to their respective sub-ADC circuits of the ADC bank 18, thereby to minimize track length between the final switches and the capacitances 50.

For completeness, with reference to FIG. 1, calibration unit 22 is provided in ADC circuitry 10 to calibrate its operation. The principle and related techniques for calibration are explained in EP2211468 relation to its FIGS. 23 and 24 in more detail.

Looking back to FIG. 1, the ADC circuitry 10 may be considered a single converter channel, i.e., receiving a single analogue input and converting it into a representative digital output. It may, however, be desirable to have multiple such converter channels operating together. An example application is when a data signal is modulated using quadrature amplitude modulation (QAM) and is transmitted in analogue (e.g., over a fibre optic link) as corresponding I and Q signals.

In that case, it may be desirable to have an I-converter channel and a Q-converter channel, synchronised with one another at least at the point of sampling (with samplers 12), to receive the I and Q analogue signals, respectively, and convert them into representative digital data for subsequent demodulation in digital. This example will be carried forward as a running example for ease of understanding, however it will of course be appreciated that there are many instances where it may be desirable to have multiple (two or more) converter channels operating together, either simultaneously and synchronised or at different timings (e.g. for power-saving reasons).

The present inventors have considered problems which may arise in such circuitry, in particular to noise in the combined digital output which is undesirable.

It is desirable to solve such problems.

According to an embodiment of a first aspect of the present invention there is provided analogue-to-digital converter circuitry, comprising: a first converter channel operable to receive a first analogue signal and generate a representative first digital signal; and a second converter channel operable to receive a second analogue signal and generate a representative second digital signal, wherein each of said converter channels comprises: sampler circuitry operable to sample the analogue signal concerned and generate therefrom a series of successive samples; a set of sub-ADC units each operable to convert a sample into a representative digital value; and control circuitry operable to provide successive samples of said series to successive sub-ADC units for conversion into respective digital values of the digital signal concerned, wherein: the series of successive samples generated in the first converter channel corresponds to the series of successive samples generated in the second converter channel, so that each sample generated in the first converter channel has a corresponding sample generated in the second converter channel and so that each digital value generated in the first converter channel has a corresponding digital value generated in the second converter channel; the control circuitry of the first converter channel is operable to provide successive samples generated in the first converter channel to successive sub-ADC units of the first converter channel in a first order, those sub-ADC units having respective positions in the first order; the control circuitry of the second converter channel is operable to provide successive samples generated in the second converter channel to successive sub-ADC units of the second converter channel in a second order, those sub-ADC units having respective positions in the second order; the control circuitry of the first converter channel is configured to transmit an alignment signal to the control circuitry of the second converter channel based on a relationship between the samples generated in the fast converter channel and positions in the first order; and the control circuitry of the second converter channel is configured, based on the alignment signal, to align the positions in the second order with the samples generated in the second converter channel so that when the control circuitry of the first converter channel provides a particular sample generated in the first converter channel to a particular sub-ADC unit of the first converter channel the control circuitry of the second converter channel provides the corresponding sample generated in the second converter channel to a sub-ADC unit of the second converter channel which corresponds to the particular sub-ADC unit of the first converter channel in that it has the same position in the second order as the position of the particular sub-ADC unit in the first order.

Thus, it may be possible to ensure aligned operation between the first and second converter channels. In particular, in the present aspect, when the control circuitry of the first converter channel provides a particular sample generated in the first converter channel to a particular sub-ADC unit of the first converter channel, the control circuitry of the second converter channel provides the corresponding sample generated in the second converter channel to the corresponding sub-ADC unit of the second converter channel.

The control circuitry of the first converter channel may be configured to transmit the alignment signal to the control circuitry of the second converter channel at a time related to a time when a sample generated in the first converter channel is provided to a sub-ADC unit having a specific position in the first order. In that case, the control circuitry of the second converter channel may be configured, based on a time at which it receives the alignment signal, to align the positions in the second order with the samples generated in the second converter channel.

The control circuitry of the first converter channel may be configured to transmit the alignment signal to indicate an order in which it provides successive pulses of a clock signal of the first converter channel to successive sub-ADC units of the first converter channel. In that case, the control circuitry of the second converter channel may be configured, based the alignment signal, to provide successive pulses of a corresponding clock signal of the second converter channel to successive sub-ADC units of the second converter channel in the same order so that corresponding pulses are provided to corresponding sub-ADC units.

The control circuitry of the first converter channel may be configured to transmit only one said alignment signal to the control circuitry of the second converter channel during an operation period. The control circuitry of the second converter channel may be configured to align the positions in the second order with the samples generated in the second converter channel based on that alignment signal.

The control circuitry of the first converter channel may be configured to transmit a plurality of said alignment signals to the control circuitry of the second converter channel during an operation period. The control circuitry of the second converter channel may be configured to align the positions in the second order with the samples generated in the second converter channel based on those alignment signals.

The sub-ADC units for each converter channel may be organised into rows and columns, the number of rows and columns being the same for both converter channels. The order of sub-ADC units may progress through the rows and columns in the same way for both converter channels. The control circuitry of the first converter channel may be configured to transmit a said alignment signal per column or for only one of the columns of the first converter channel to the control circuitry of the second converter channel indicating when the sub-ADC unit in a given row of that column is to receive the next sample. The control circuitry of the second converter channel may be configured, based on each of those alignment signals, to align the positions in the second order with the samples generated in the second converter channel in respect of the corresponding column of the second converter channel concerned.

The control circuitry of the first converter channel may be configured to transmit a said alignment signal for only a given one of the columns of the first converter channel. The control circuitry of the first converter channel may be configured, based on that alignment signal, to align the positions in the first order with the samples generated in the first converter channel in respect of the other columns of the first converter channel. Further, the control circuitry of the second converter channel may be configured, based on that alignment signal, to align the positions in the second order with the samples generated in the second converter in respect of the column of the second converter channel corresponding to the given one of the columns of the first converter channel, and based on that alignment to align the positions in the second order with the samples generated in the second converter channel in respect of the other columns of the second converter channel.

The first and second converter channels may be configured to generate their respective series of successive samples in synchronisation with a common clock signal.

The sub-ADC units of the first converter channel may be configured to operate based upon respective first clock signals and the sub-ADC units of the second converter channel may be configured to operate based upon respective second clock signals, the second clock signals corresponding respectively to the first dock signals. In that case, the control circuitry of the second converter channel may be configured to align the positions in the second order with the samples generated in the second converter channel by controlling which of the second clock signals are provided to which of the sub-ADC units of the second converter channel.

The first and second converter channels may be configured to mark a pair of corresponding digital values to indicate that they correspond to one another based on that pair of digital values having been generated by a pair of corresponding sub-ADC units.

A pair of corresponding sub-ADC units may be configured to act as a pair of marking sub-ADC units and may be configured to mark one or more digital values that they generate to enable one or more pairs of corresponding digital values to be identified.

Each pair of a plurality of pairs of corresponding sub-ADC units may be configured to act as a pair of marking sub-ADC units and may be configured to mark one or more digital values that they generate to enable pairs of corresponding digital values to be identified.

The converter channels may be configured such that not all of the pairs of corresponding sub-ADC units are configured to act as a pair of marking sub-ADC units.

Each pair of corresponding sub-ADC units acting as a pair of marking sub-ADC units may be configured to regularly mark digital values that they generate to enable pairs of corresponding digital values to be identified.

The converter channels, or the sub-ADC units concerned of the converter channels, may be configured to: add one or more additional bits only to one or more pairs of corresponding digital values to be marked so as to mark a pair of corresponding digital values; or add one or more additional bits to all of the digital values and to mark a pair of corresponding digital values by setting the value of the one or more additional bits to a marking value.

The converter channels, or the sub-ADC units concerned of the converter channels, may be configured to add a plurality additional bits to the digital values, and to mark different pairs of corresponding digital values with different marking values.

The converter channels, or the sub-ADC units concerned of the converter channels, may be configured to alter the digital values for a pair of corresponding digital values so as to mark that pair of corresponding digital values.

The analogue-to-digital converter circuitry may comprise a digital unit common to the first and second converter channels and configured to receive the digital values from the first and second converter channels as input digital values, process those input digital values and output resultant digital values. The digital unit may be operable to identify which input digital values are corresponding digital values based on said marking.

For each converter channel, the sub-ADC units may be configured to perform their respective conversions in a time-interleaved manner based on when they are provided with their respective samples, so that the digital values representative of those samples are produced successively.

According to an embodiment of a second aspect of the present invention there is provided semiconductor integrated circuitry, such as an IC chip, comprising the analogue-to-digital converter circuitry according to the aforementioned first aspect of the present invention.

The present invention extends to method and computer program aspects (e.g. for control) corresponding to the apparatus (circuitry) aspects.

Reference will now be made, by way of example only, to the accompanying figures, of which:

FIG. 1, discussed above, is a schematic diagram of previously-considered analogue-to-digital converter (ADC) circuitry;

FIG. 2, discussed above, is a schematic circuit diagram of the sampler of FIG. 1;

FIG. 3, discussed above, shows schematic waveforms useful for understanding FIG. 2;

FIG. 4, discussed above, is a schematic circuit diagram of parts of the FIG. 1 ADC circuitry relating to its demultiplexers;

FIG. 5, discussed above, is a schematic diagram useful for understanding further the operation of the demultiplexers;

FIG. 6, discussed above, is a schematic diagram useful for understanding the principle of operation of the ADC banks of FIG. 1;

FIG. 7, discussed above, is a schematic diagram useful for understanding a possible application of SAR—ADC circuitry to the FIG. 6 circuitry;

FIG. 8, discussed above, is a schematic diagram useful for understanding a possible layout for the FIG. 1 ADC circuitry;

The present inventors have considered that noise in the combined digital output may be the manifestation of misalignment between the two converter channels.

Figure 9:
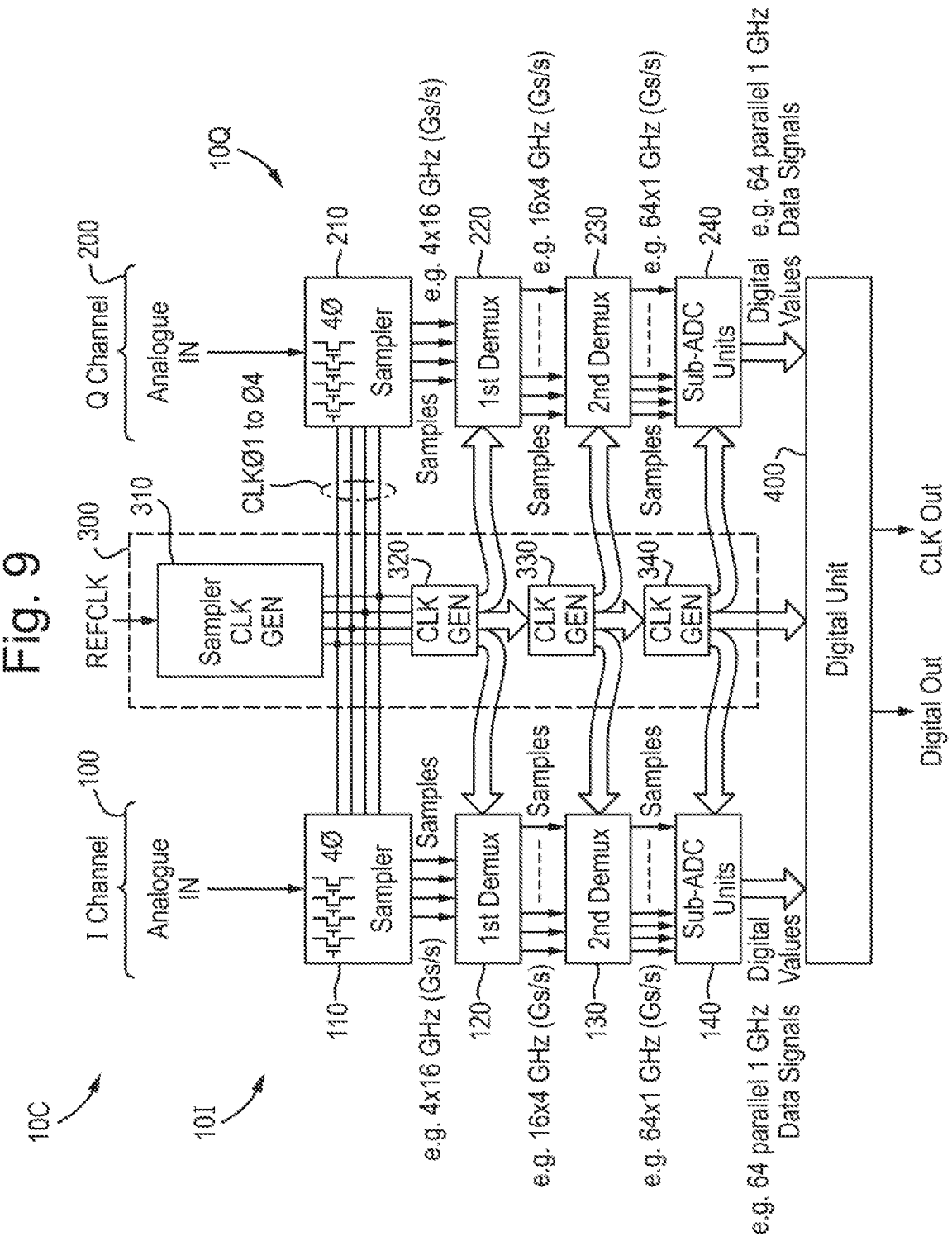
FIG. 9 is a schematic diagram showing parts of ADC circuitry embodying the present invention.

Continuing the running example, reference is made to FIG. 9.

High-speed ADC circuitry of the present applicant is typically characterised in that it is necessary to generate and distribute many fast clock signals, where the timing of those signals relative to one another and to clock signals in other circuits affects the operation of functional units in the ADC circuitry and thus also of the ADC circuitry as a whole.

FIG. 9 is a schematic diagram showing parts of combined ADC circuitry 10C, as an example of circuitry in which the present invention may be employed. Circuitry 10C comprises ADC circuitry 100 shown on the left-hand side, ADC circuitry 200 shown on the right-hand side, and clock generation and distribution circuitry 300 shown in the middle. Broadly speaking, ADC circuitry 100 with its portion of circuitry 300 corresponds to a first or I-converter channel and is denoted 10I given its similarity to circuitry 10 of FIG. 1, and ADC circuitry 200 with its portion of circuitry 300 corresponds to a second or Q-converter channel and is denoted 10Q for similar reasons.

Figure 1:
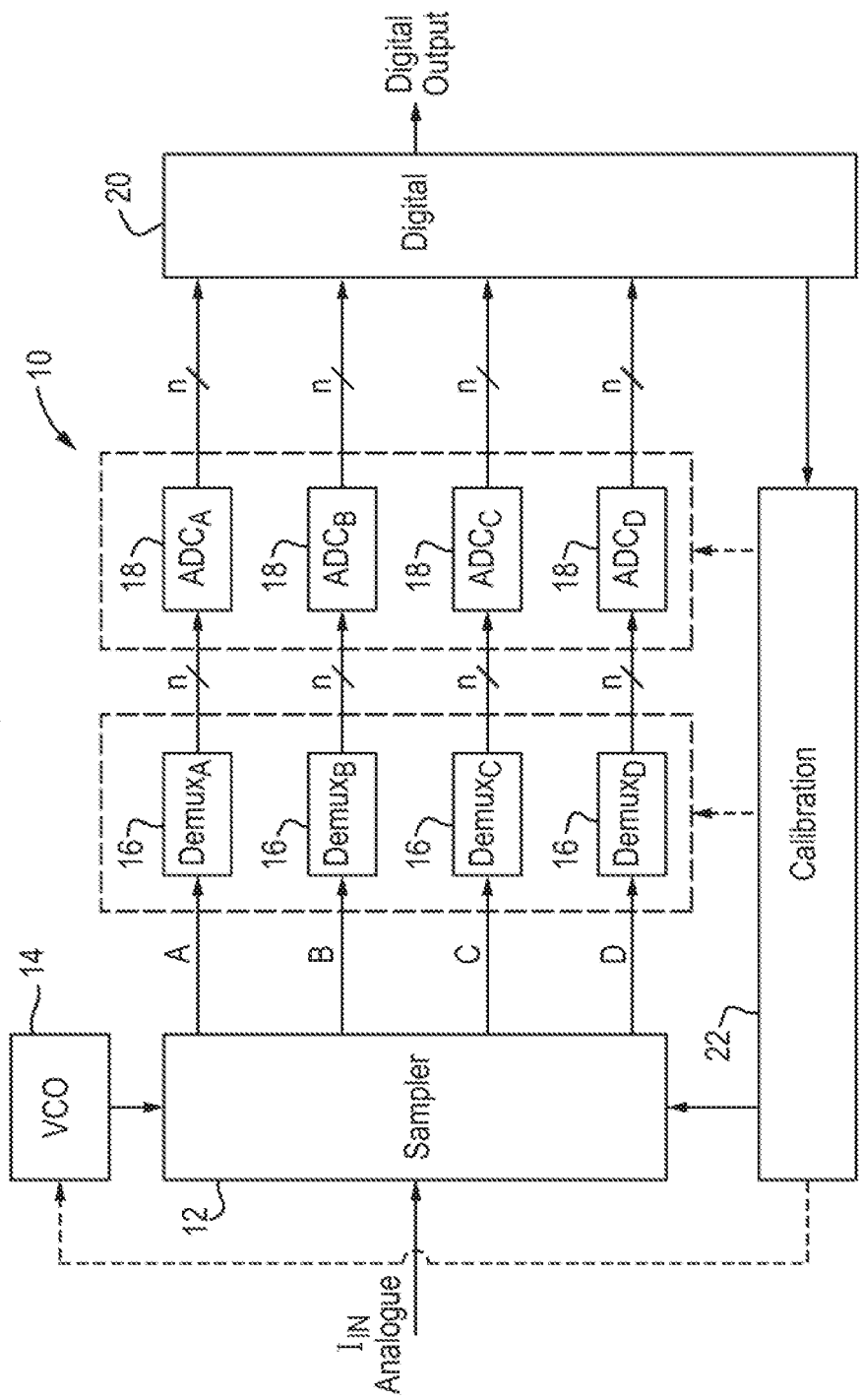
Figure 2:
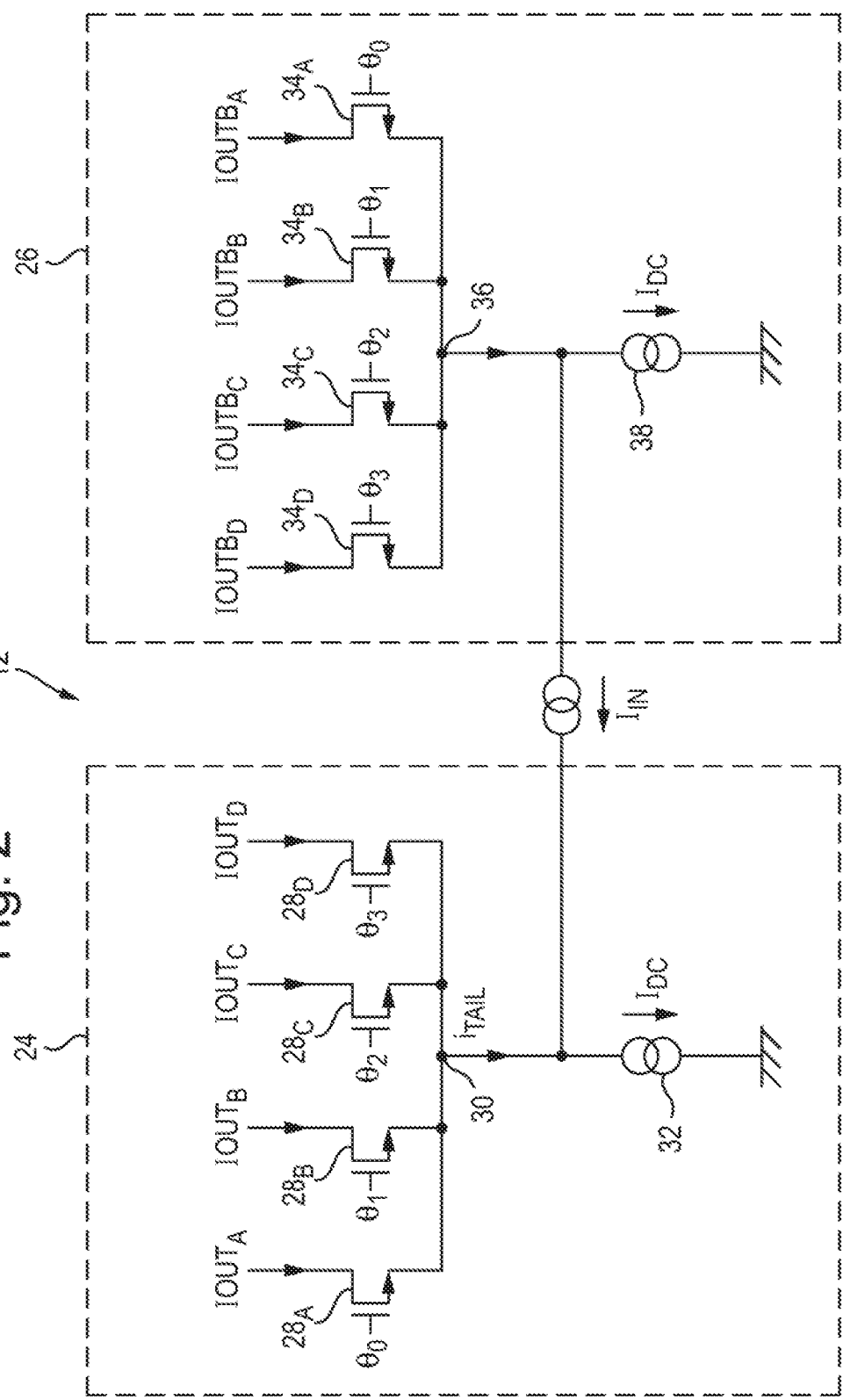
Figure 3:
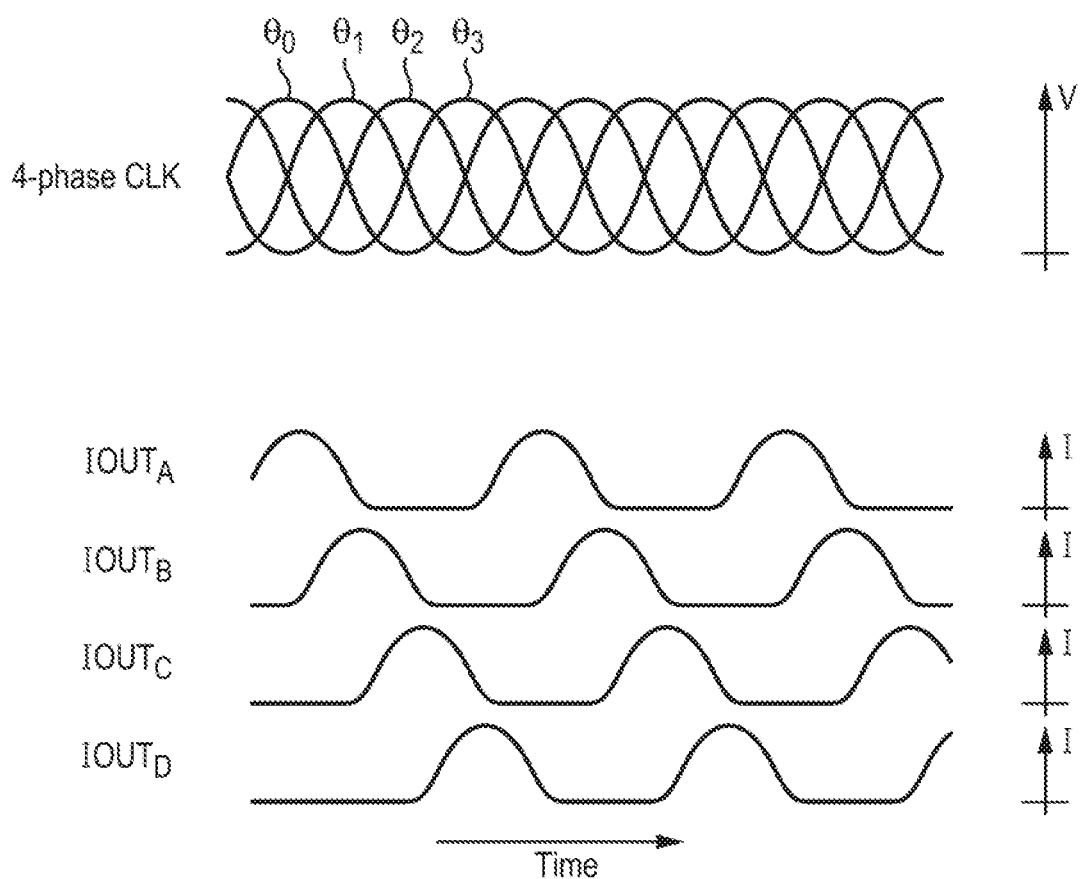

The I-channel ADC circuitry 100 comprises sampler circuitry 110, which corresponds to sampler 12 in FIG. 1. Again, either single-ended or differential signals could be used.

Figure 4:
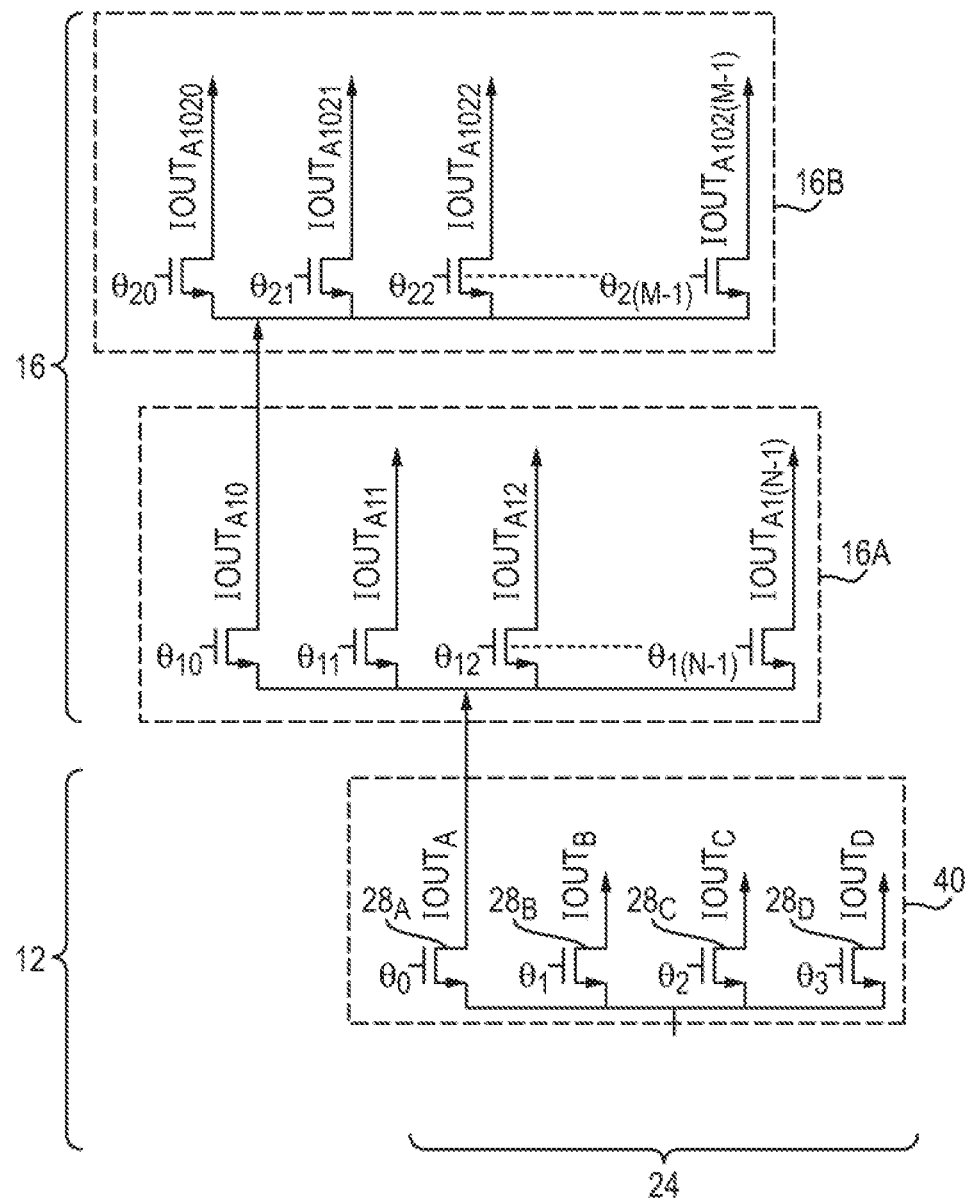
Figure 5:
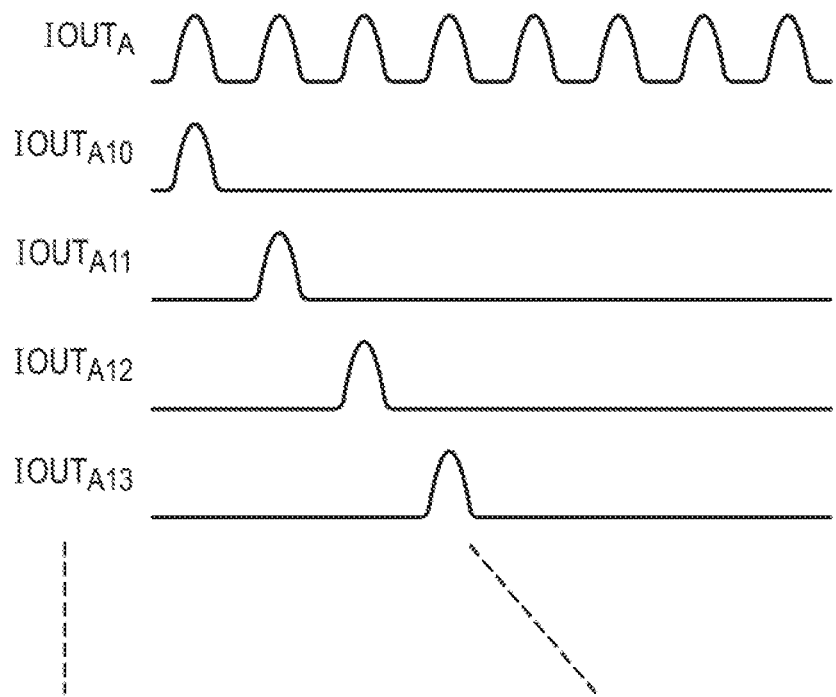
Figure 6:
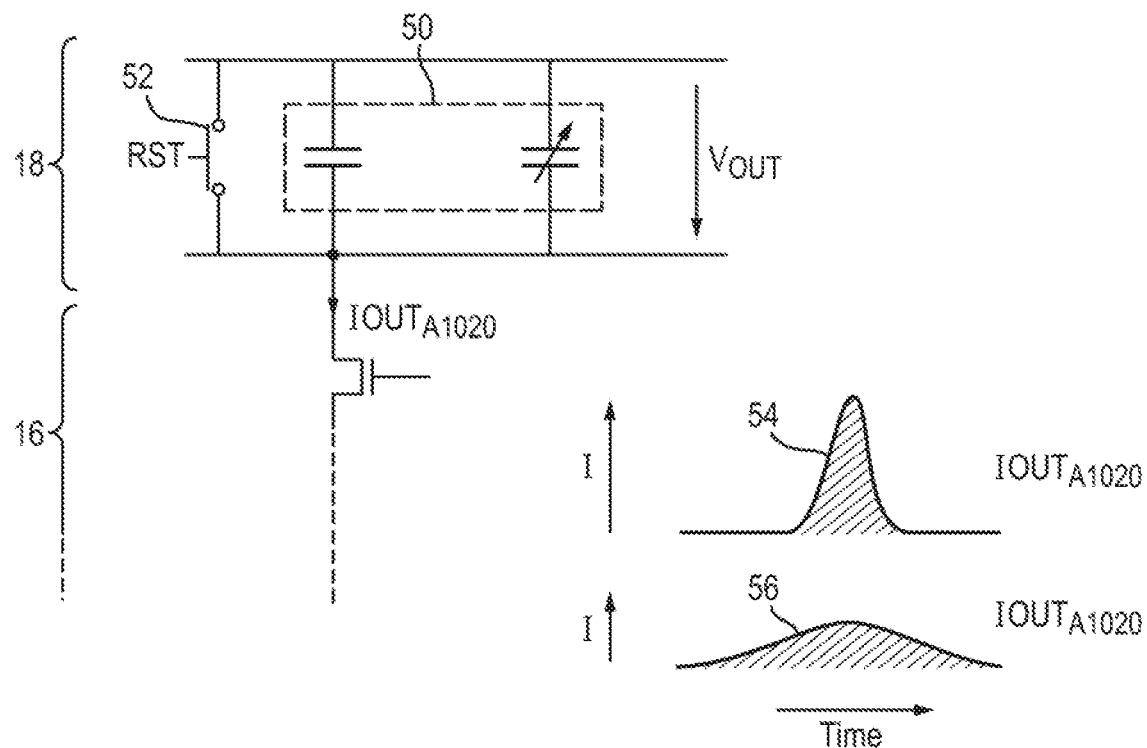

A desired ADC sample rate of 64 Gs/s is assumed simply as an example, with two stages of demultiplexing shown a 120 and 130, each performing 1:4 demultiplexing, and with sub-ADC units 140. The demultiplexing stages 120 and 130 correspond to stages 16A and 16B (see FIGS. 1, 4 and 8) and the sub-ADC units 140 correspond to the sub-ADC units 18 (see FIGS. 1, 6 and 8).

The sampler circuitry 110 is configured to take samples from the analogue input at the overall 64 Gs/s sample rate by current steering in current mode, and to output 4 sample streams (single-ended or differential) each at 16 Gs/s (which may be expressed herein as 16 GHz), with the first demultiplexing stage 120 outputting 16 4 Gs/s signals, and with the second demultiplexing stage 130 outputting 64 1 Gs/s signals. The sub-ADC units 140 are configured to output 64 parallel 1 GHz digital data signals.

In this example, the Q-channel ADC circuitry 200 is substantially the same as the I-channel ADC circuitry 100, except for differences which will be explained later, and thus duplicate description can be omitted. In short the sampler 210, the two-stages of demultiplexing 220 and 230 and the sub-ADC units 240 correspond respectively to the sampler 110, the two-stages of demultiplexing 120 and 130 and the sub-ADC units 140.

The clock generation and distribution circuitry 300 comprises a clock generator 310 configured to generate the clock signals CLK ϕ1 to CLK ϕ4 from a reference clock signal REFCLK and supply them to the sampler circuits 110 and 210. Further, shown are three stages of clock generation 320, 330, 340, in order to take the input clock signals CLK ϕ1 to CLK ϕ4 and generate in turn the dock signals (4 GHz and 1 GHz) required by the two stages of demultiplexing and the sub-ADC units 120 & 220, 130 & 230, and 140 & 240, as indicated in FIG. 9. Although the clock signals CLK ϕ1 to CLK ϕ4 generated by clock generator 310 are sinusoidal, the clock signals generated by the three stages of clock generation 320, 330, 340 need not be, and may be switched-logic signals. Indeed, the clock signals CLK ϕ1 to CLK ϕ4 may also be non-sinusoidal in some applications.

The same clock generation and distribution circuitry 300 (at least, schematically) accordingly provides its clock signals to the I-channel ADC circuitry 100, as well as to the Q-channel ADC circuitry 200. It may be that the whole clock generation and distribution circuitry 300 is shared by the I- and Q-channel ADC circuitry 100 and 200, as shown. However, in another embodiment, it may be that e.g., only the clock generation unit 310 is shared, with there being a set of subsequent clock generation units 320, 330, 340 for the I-channel ADC circuitry 100 and another set of subsequent clock generation units 320, 330, 340 for the Q-channel ADC circuitry 200, both sets sharing the clock generator 310.

Figure 8:
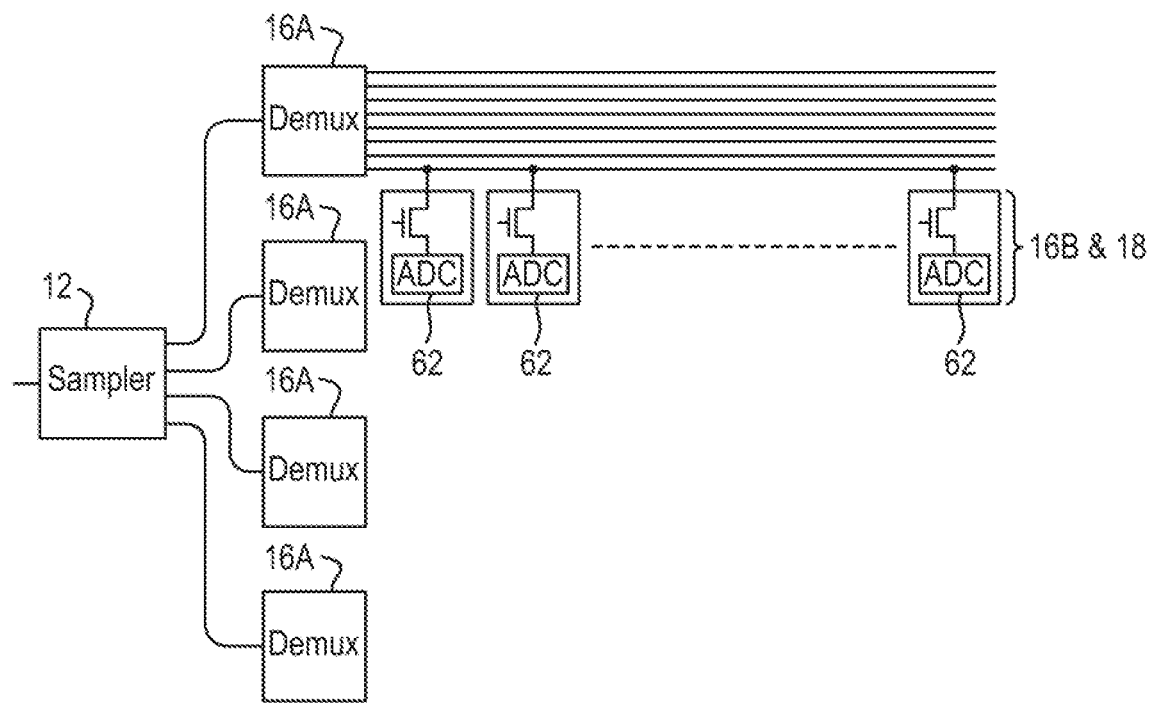
Figure 10:
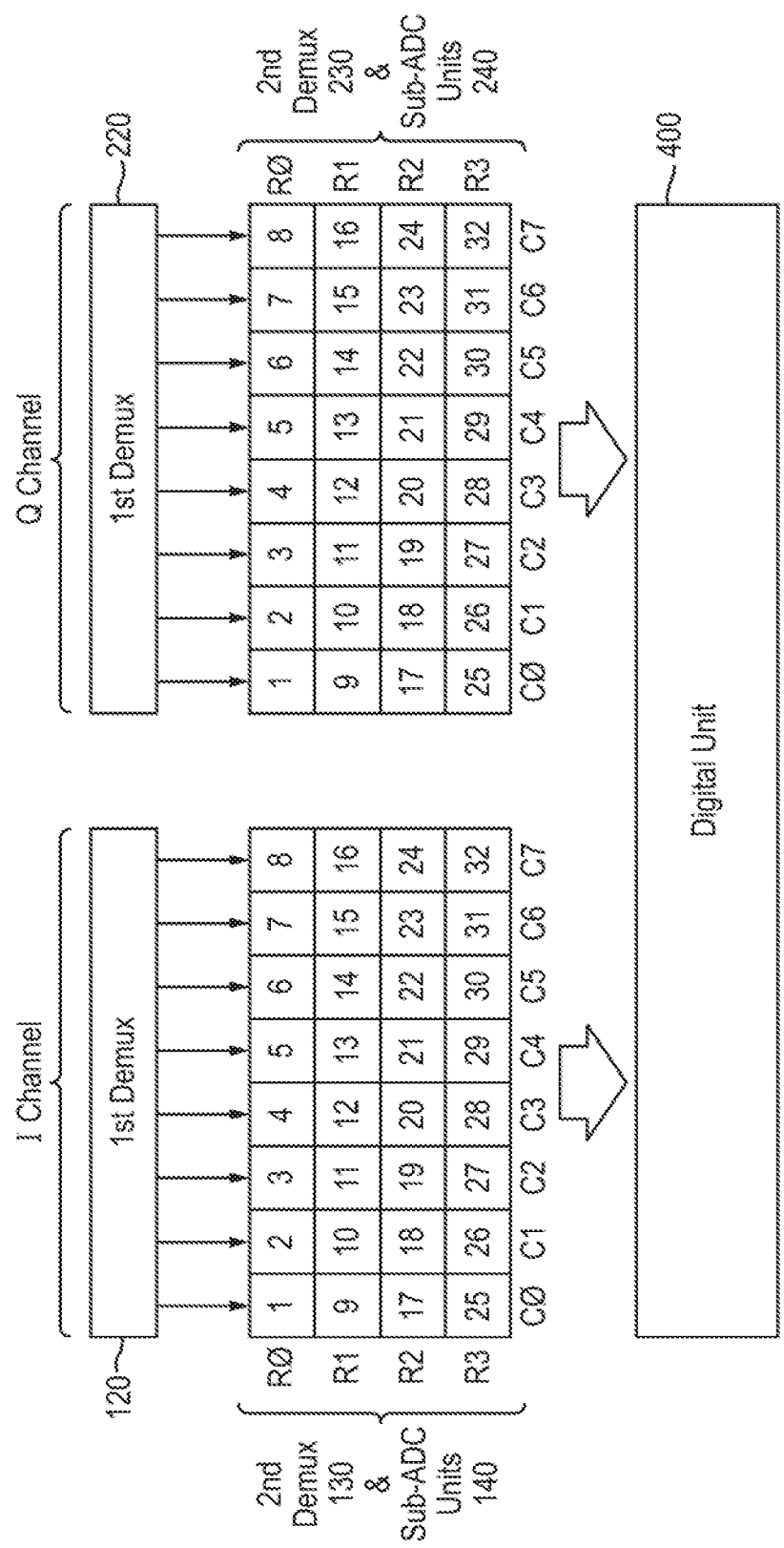
FIG. 10 is a schematic diagram of parts of the circuitry of FIG. 9.

Recall from FIG. 8 that the sub-ADC unit 62 may be arranged in an array of rows and columns, with the final stage of demultiplexing 16B being earned out in the array. FIG. 10 is a schematic diagram of parts of the circuitry 10C of FIG. 9, but with such an array structure represented for both the I-channel (ADC circuitry 100) and the Q-channel (ADC circuitry 200). Thus, circuitry elements in FIG. 10 which correspond to circuitry elements in FIG. 9 are denoted with the same reference numerals, and some elements present in FIG. 9 have been omitted in FIG. 10 for simplicity. Also, although the 1$^{st}$ demultiplexer stages 120 and 220 in FIG. 9 each have 16 parallel outputs, in FIG. 10 if it assumed that there are 8 parallel outputs for simplicity.

As an overview, the array of sub-ADC units 140 in FIG. 10 is indicated as an array of boxes, with each box corresponding to a sub-ADC unit. The same is true for the array of sub-ADC units 240. The columns in the arrays of FIG. 10 corresponds to the rows in FIG. 8. Thus, each array in FIG. 10 comprises 8 columns labelled C0 to C7 and 4 rows labelled R0 to R3.

It will be appreciated that the array of boxes is schematic, and that in reality the positional layout of the sub-ADC units may be less regular.

In each array, the sub-ADC units have been numbered from 1 to 32, to indicate an order in which successive samples may be provided to the sub-ADC units for conversion into representative digital values. Looking back to FIGS. 1 to 8, it will be appreciated that in the present embodiment the successive samples are provided to the sub-ADC units one-by-one going column-by-column along the rows, and progressing from one row to the next. Each column of sub-ADC units in FIG. 10 is connected to the same output from the preceding demultiplexer stage (120 or 220), with the sub-ADC units in each column being selected one-by-one in order (e.g., down the column), for example using switches such as those shown for each sub-ADC unit 62 in FIG. 8, thus implementing the $2^{nd}$ stage of demultiplexing (130 or 230) as in FIG. 9. Again, it will be understood that the layout of sub-ADC units is schematic, with the array showing the logical or connection-related position rather than necessarily physical relative position, so that for example the sub-ADC units can be readily understood as being accessed one-by-one along each row. Looking back to FIG. 8 for example, it will be appreciated that the likely physical layout would lead to hops along each row in a pattern.

Figure 7:
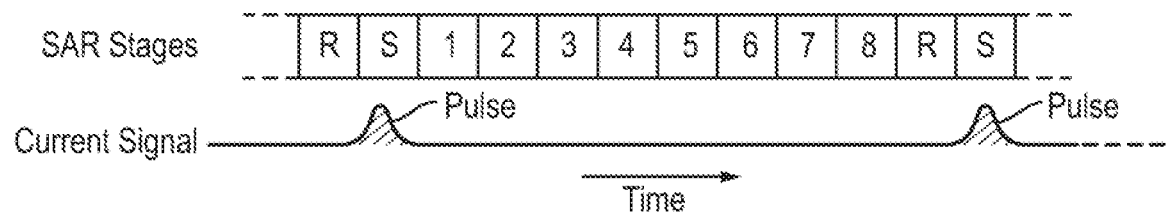

Looking back to FIG. 7, each sub-ADC unit in FIG. 10 operates as a SAR sub-ADC unit and outputs a digital value once it has processed the current sample. Further, the sub-ADC units of an array operate in a time-interleaved (staggered) fashion outputting their digital values thus also one-by-one stepping through the array in the order from 1 to 32 as indicated. The output digital values are then provided to the common digital unit 400.

Figure 11:
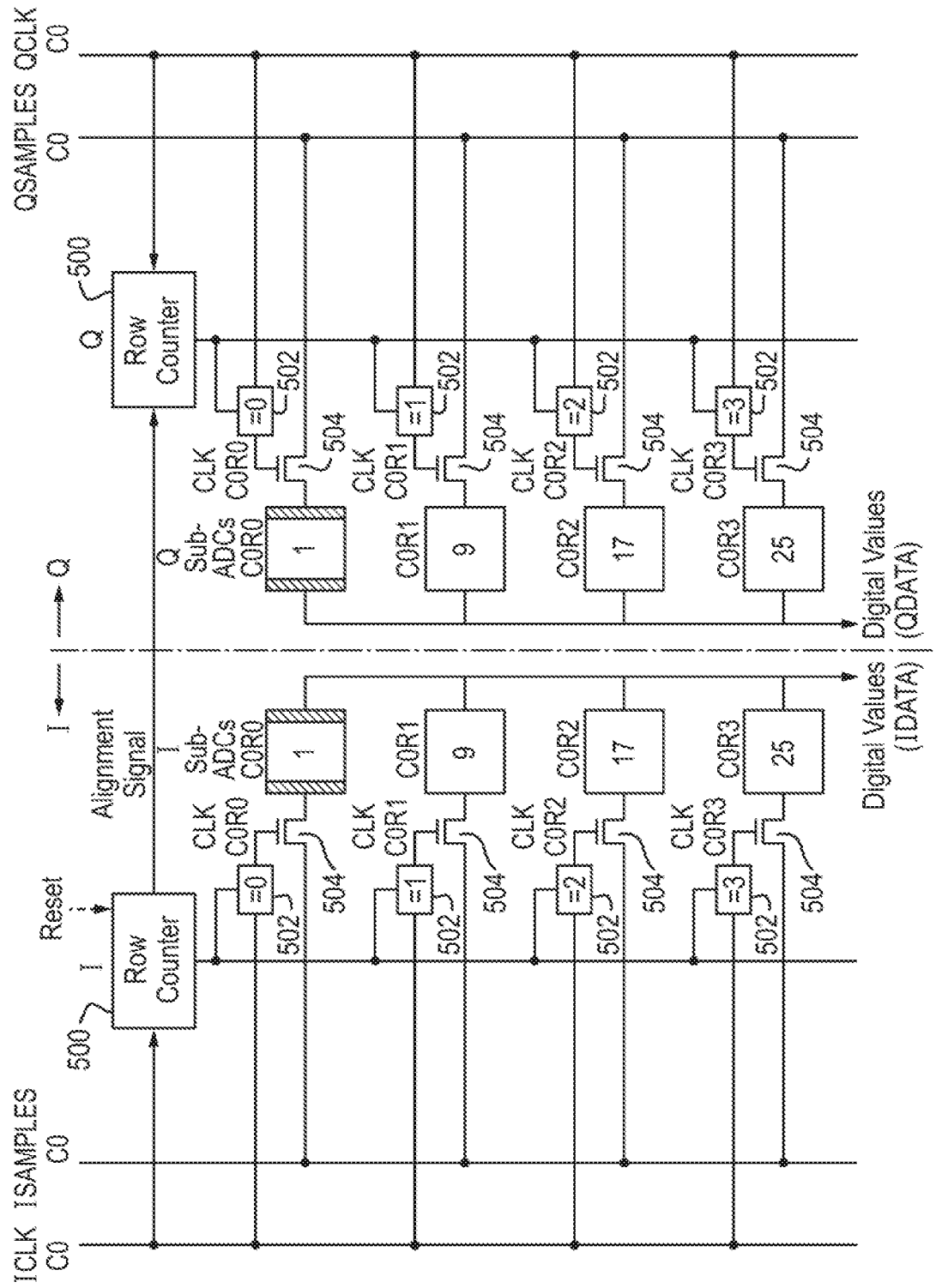
FIG. 11 is a schematic diagram showing the sub-ADC units in column 0 for both the I-channel converter and the Q-channel converter of FIG. 10.
Figure 12:
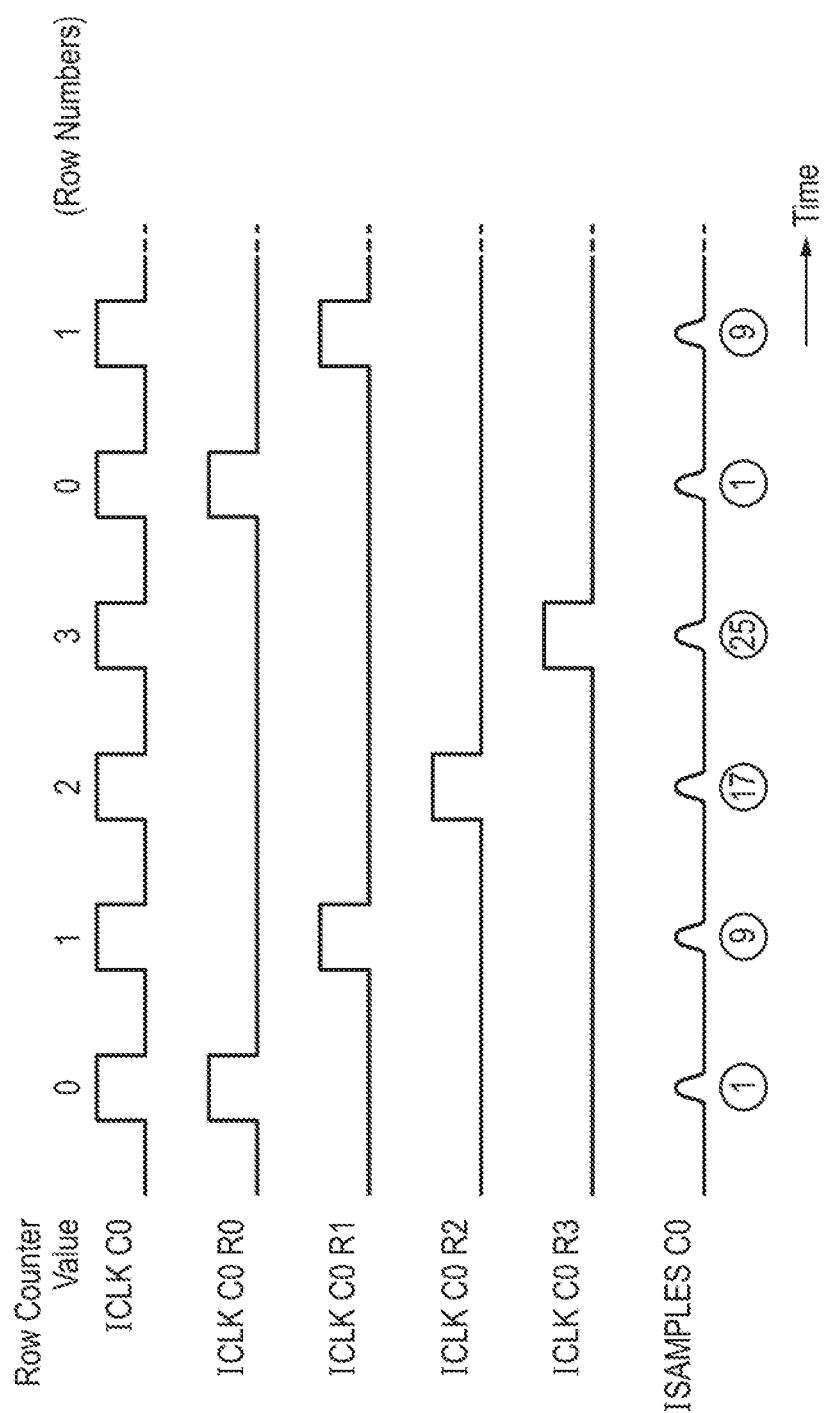
FIG. 12 is a timing diagram useful for understanding FIG. 11.

FIGS. 11 and 12 are useful for better understanding how the arrays operate, and focus on a single column (in this case, column 0) in each for simplicity. The other columns operate in a similar way.

FIG. 11 is a schematic diagram showing the sub-ADC units in column 0 for both the I-channel converter and the Q-channel converter of FIG. 10, along with additional circuitry for supplying signals to those sub-ADC units and receiving the digital values that they output. FIG. 12 is a timing diagram useful for understanding FIG. 11.

The two columns each comprise a row counter 500 and a logic element 502 per sub-ADC unit, and are connected to receive a stream of samples and a clock signal as indicated. Looking at just the I-channel converter for example, the row counter 500 is connected to receive the clock signal for that column ICLK C0, and to cycle through the row numbers as indicated in FIG. 12 (i.e. 0, 1, 2, 3, 0, 1, 2, 3 and so on and so forth). An optional reset signal (specific to the I-channel) may determine when that row counter 500 starts at number 0.

The logic elements 502 are connected to receive the row counter value and the column clock signal ICLK C0 and to pass a clock pulse from the clock signal ICLK C0 when the row counter value equals the number of the row concerned, thereby to generate a clock signal specific to the sub-ADC unit for that row and column. This is indicated in FIG. 12. For example, when the row counter for column 0 has value 1, the clock signal ICLK C0R1, which is for the sub-ADC unit in column 0 (C0) and row 1 (R1), exhibits a pulse from the column clock signal ICLK C0. The sub-ADC unit concerned here is numbered 9 in the order in FIGS. 10 and 11. As another example, when the row counter for column 0 has value 3, the clock signal ICLK C0R3, which is for the sub-ADC unit in column 0 (C0) and row 3 (R3), exhibits a pulse from the column clock signal ICLK C0. The sub-ADC unit concerned here is numbered 25 in the order in FIGS. 10 and 11.

The sub-ADC units in column 0 are connected to receive the samples for that column ISAMPLES C0 via respective switches 504 (which correspond to those grouped with the sub-ADC units 62 in FIG. 8) which are controlled by their respective clock signals. Thus, as will be appreciated from FIG. 12, the sub-ADC units in column 0 receive successive pulses from that column one-by-one down the rows, following the order 1, 9, 17, 25, 19, 17, 25 and so on and so forth, based on the overall order in FIG. 10. This numbering is indicated under the pulses (samples) in FIG. 12. This corresponds to a repeating pattern of C0R0, C0R1, C0R2, C0R3.

Column 0 for the Q-channel converter operates in the same way, based on its corresponding signals QCLK C0 and QSAMPLES C0, and duplicate description will be omitted.

For now, simply for the sake of argument, it will be assumed that the row counter 500 for column 0 in the Q-channel converter also receives a reset signal (not shown), although in the present embodiment it need not. The alignment signal shown transmitted between the row counters in FIG. 11 will also be ignored for now, as will the emphasis placed on the sub-ADC units given order number 1 in FIG. 11.

Figure 13:
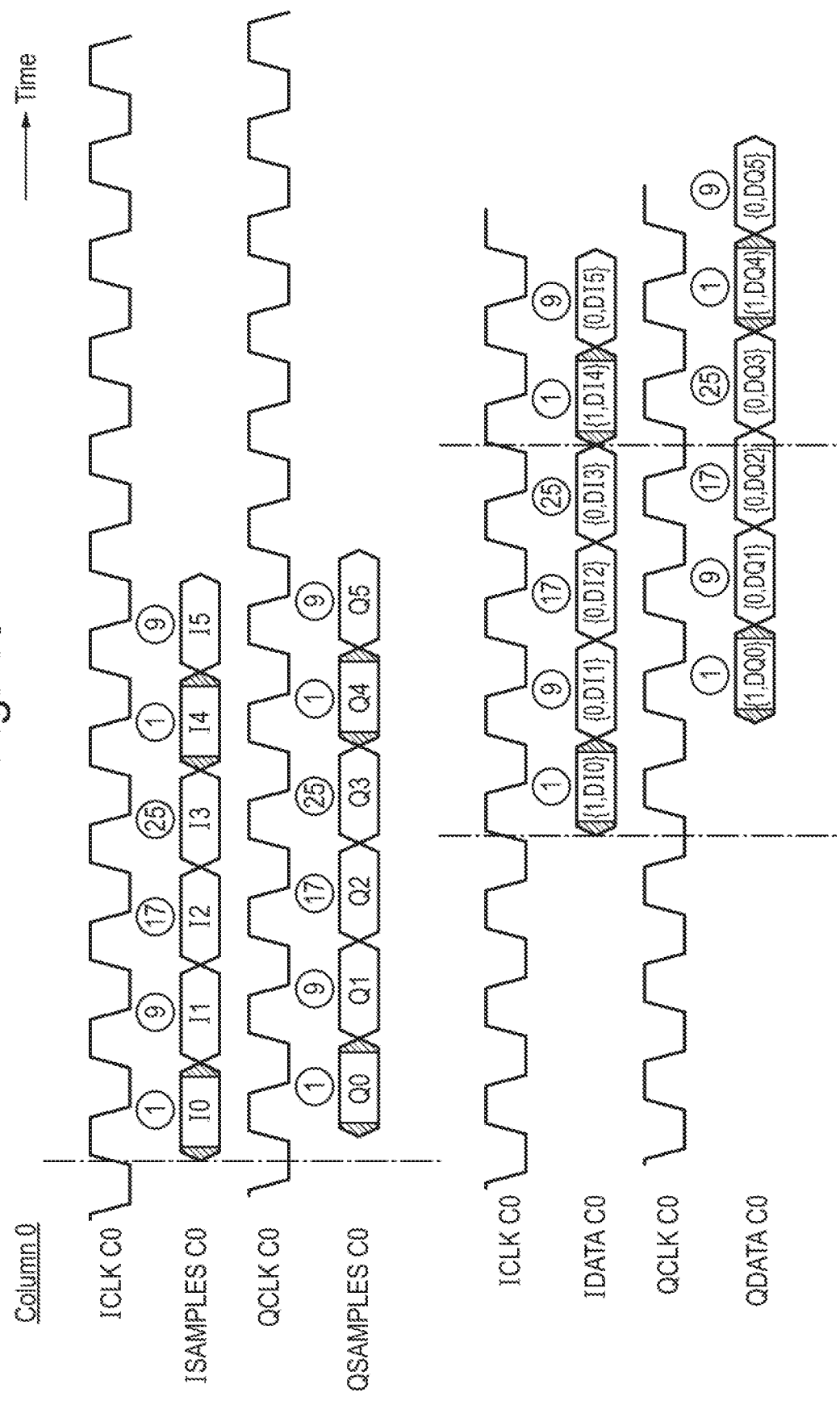
FIG. 13 is a schematic timing diagram useful for understanding a potential problem in the circuitry 10C of FIG. 9.

FIG. 13 is a schematic timing diagram useful for understanding a potential problem in the circuitry 10C of FIG. 9 (which is solved by the present invention). For ease of comparison, focus is again placed on column 0 using the example layout in FIGS. 10 to 12.

In the upper half of FIG. 13, a succession of samples for column 0 in the I-channel converter are shown labelled I0 to I5 against the clock signal for that column ICLK C0. A succession of the corresponding samples for column 0 in the Q-channel converter are shown labelled Q0 to Q5 against the clock signal for that column QCLK C0. For consistency with FIGS. 10 to 12, it is indicated by the samples in FIG. 13 that the samples are provided one-by-one to the corresponding sub-ADC units in the repeating order 1, 9, 17, 25 in line with FIG. 10.

In the lower half, the digital values output by the sub-ADC units are shown against the column clocks ICLK C0 and QCLK C0 thus, DI0 is the digital value representative of sample I0, and so on and so forth. However, it is assumed that there has been some delay (in the digital circuitry e.g., due to some processing) between the conversion of the samples into digital values and the eventual output of those digital values (perhaps adjusted by the processing. Again, for now, it will be ignored that certain samples and digital values are emphasised in FIG. 13 and that the digital values all include a flag bit (shown with a value 0 or 1) in addition to the digital value (e.g., DI0) which is representative of the corresponding sample.

As indicated in FIG. 13, it may be that the delay experienced in the digital unit 400 by the digital values (DI0, DI1 etc) and clock signal ICLK C0 of the I-channel converter may be different from that experienced by the digital values (DQ0, DQ1, etc) and the clock signal QCLK C0 of the Q-channel converter. Thus a digital unit receiving all of those values may not be able to determine which digital value (e.g., DI1) from the I-channel converter corresponds to which digital value (e.g., DQ1) from the Q-channel converter, to form a pair of corresponding digital values. For example, imagining the digital values in FIG. 13 being presented without the help of their labelling, it might not be known if the value DI2 corresponds to DQ0, DQ1 or DQ2.

To resolve this issue the alignment signal indicated in FIG. 11 is transmitted from the I-channel converter to the Q-channel converter, and this will be considered in more detail now.

It will be appreciated from FIGS. 10 to 12 that the control circuitry of the I-channel converter (for example, the row counters corresponding to row counter 500 and the clock signals which control them) is operable to provide successive samples generated in the I-channel converter to successive sub-ADC units of the I-channel converter in a first order, those sub-ADC units having respective positions in the first order (see the numbering from 1 to 32 in FIG. 10). Similarly, the corresponding control circuitry of the Q-channel converter is operable to provide successive samples generated in the Q-channel converter to successive sub-ADC units of the Q-channel converter in a second order, those sub-ADC units having respective positions in the second order (see the numbering from 1 to 32 in FIG. 10). Note also the that I-channel row counter 500 in FIG. 11 is controlled by a reset signal whereas the corresponding Q-channel row counter 500 in FIG. 11 is not.

With this in mind, the control circuitry of the I-channel converter is configured to transmit an alignment signal (such as the one shown in FIG. 11) to the control circuitry of the Q-channel converter based on a relationship between the samples generated in the I-channel converter and positions in the first order. Then, the control circuitry of the sec Q-channel converter is configured, based on the alignment signal, to align the positions in the second order with the samples generated in the Q-channel converter so that when the control circuitry of the I-channel converter channel provides a particular sample generated in the I-channel converter to a particular sub-ADC unit of the I-channel converter the control circuitry of the Q-channel converter provides the corresponding sample generated in the Q-channel converter to a sub-ADC unit of the Q-channel converter which corresponds to the particular sub-ADC unit of the I-channel converter in that it has the same position in the second order as the position of the particular sub-ADC unit in the first order.

Thus, in the context of the detailed example in FIG. 11, when the I-channel row counter 500 is reset, this corresponds to it starting to count from 0 and thus to the next sample of the ISAMPLES C0 being provided to the sub-ADC unit in column 0 (C0) and row 0 (R0), i.e. sub-ADC unit C0R0. This sub-ADC unit has order number 1 in FIGS. 10 and 11 and is emphasised in FIG. 11.

When the I-channel row counter 500 is reset, the alignment signal is sent to the Q-channel row counter 500 so that it is also reset at the same time. This corresponds to that row counter 500 also starting to count from 0 and thus to the next sample of the QSAMPLES C0 being provided to the sub-ADC unit in column 0 (C0) and row 0 (R0), i.e. sub-ADC unit C0R0. This sub-ADC unit has order number 1 in FIGS. 10 and 11 and is also emphasised in FIG. 11.

Thus, due to the alignment signal and the operation of the control circuitry in the I-channel and Q-channel converters, when the control circuitry of the I-channel converter channel provides a particular sample generated in the I-channel converter to a sub-ADC unit C0R0 of the I-channel converter the control circuitry of the Q-channel converter provides the corresponding sample generated in the Q-channel converter to sub-ADC unit C0R0 of the Q-channel converter, which corresponds to sub-ADC unit C0R0 of the I-channel converter in that it has the same position (position 1) in the second order as the position (position 1) of the particular sub-ADC unit in the first order.

Essentially, the alignment signal and the operation of the control circuitry in the I-channel and Q-channel converters ensures that when a sample is provided to one sub-ADC unit in the I-channel converter the corresponding sample is provided to the corresponding sub-ADC unit in the Q-channel converter. That is, it is known that corresponding pairs of samples are provided to corresponding pairs of sub-ADC units.

The sub-ADC unit C0R0 of the I-channel converter and the sub-ADC unit C0R0 of the Q-channel converter form a corresponding pair of sub-ADC units, which receive such a corresponding pair of samples, and indeed they have been emphasised in FIG. 11 to indicate this.

Of course, the sub-ADC unit C0R1 of the I-channel converter and the sub-ADC unit C0R1 of the Q-channel converter form a corresponding pair of sub-ADC units, and the sub-ADC unit C0R2 of the I-channel converter and the sub-ADC unit C0R2 of the Q-channel converter form a corresponding pair of sub-ADC units, and the sub-ADC unit C0R3 of the I-channel converter and the sub-ADC unit C0R3 of the Q-channel converter form a corresponding pair of sub-ADC units. This correspondence follows the order numbering in FIG. 10, i.e. 1 to 1, 9 to 9, 17 to 17 and 25 to 25, because the first and second orders have been set up to achieve this for ease of understanding.

Based on this control, a corresponding pair of sub-ADC units, such as the sub-ADC unit C0R0 of the I-channel converter and the sub-ADC unit C0R0 of the Q-channel converter may be configured as marking sub-ADC units, so that together they mark digital values which they create in some way to identify corresponding pairs of digital values. For example, they could mark all of the digital values which they create or only one corresponding pair or perhaps a corresponding pair from time to time (e.g. regularly). Thus, a corresponding pair of sub-ADC units may be considered to be or act as a corresponding pair of marking sub-ADC units all of the time or only at certain times.

One way in which such a corresponding pair of marking sub-ADC units (or associated circuitry) may mark a corresponding pair of digital values is to add one or more flag bits to those digital values with a given flag value (e.g. a value 1 where there is one additional flag bit). The other sub-ADC units could either not add such flag bits or add such flag bits but with a given non-flag value (e.g. a value 0 where there is one additional flag bit). This latter case may of course be convenient so that all of the digital values have the same number of additional bits (and thus form digital words of the same number of bits).

Continuing the above example from FIG. 11 for convenience, the sub-ADC unit C0R0 of the I-channel converter and the sub-ADC unit C0R0 of the Q-channel converter may be configured to mark all of the digital values which they create with a single flag bit having a flag value 1, and the other sub-ADC units in FIG. 11 may be configured add a single flat bit having the flag value 0 to the digital values which they create so as effectively not to mark their digital values.

This pattern of flag bits is indicated in FIG. 13. For example, samples I0 and Q0 are assumed to be provided to the sub-ADC units C0R0, and thus the digital values DI0 and DQ0 have a flag bit with value 1 as indicated (as 1,DI0 and 1,DQ0). These values have been emphasised as being marked, as have the originating samples I0 and Q0, for ease of understanding. The next samples provided to the sub-ADC units C0R0 are the samples I4 and Q4, and thus the digital values DI4 and DQ4 also have a flag bit with value 1 as indicated (these values are thus also emphasised as being marked). The other digital values in FIG. 13 have a flag bit with value 0 (e.g. 0,DI1) and are thus not marked.

Based on the marking, it will be appreciated that, imagining the digital values in FIG. 13 being presented without the help of their labelling, the marking would allow digital circuitry 400 or subsequent digital circuitry to know (within certain limits—e.g. based on how often the marking occurs, and how the marking is carried out) that the value DI0 corresponds to DQ0, and thus also that the value DI2 corresponds to DQ2. The digital circuitry 400 or subsequent digital circuitry may take the form of a processing core circuit, such as a processor.

Of course, it would be possible to add more than one additional bit to the digital values and thus use more complex flag values as a way of addressing the marked corresponding pairs of digital values. For example, with two additional bits the digital values based on samples I0 and Q0 could be marked such as 11,DI0 and 11,DQ0, and the digital values based on samples I4 and Q4 could be marked such as 10,DI4 and 10,DQ4. In this way, it can be understood that there could be allow digital circuitry to know (within wider limits than if only one additional bit were used) that the value DI0 corresponds to DQ0, and thus also that the value DI2 corresponds to DQ2.

Another way in which such a corresponding pair of marking sub-ADC units (or associated circuitry) may mark a corresponding pair of digital values is to alter the digital values themselves, so that they can be identified from other digital values. For example, if they were 6-bit values, they could be altered to be 00000000, or 11111111, or 10101010, or some other value which (because of the nature of the successive unaltered digital values) may stand out—or stand out most of the time—and be identifiable. These are of course only simple examples. This form of marking may be advantageous in that no additional bits are required, however a disadvantage is that the actual converted digital values are corrupted. One possible way of overcoming this disadvantage may be for example to mark digital values by applying a given reversible alteration operation which leaves a signature in the digital values, e.g. inverting them about mid-scale if their unaltered values meet predetermined criteria (such as that they are near full scale). This may render the marked values identifiable—i.e. there may be a signature which can be identified (because of the nature of the successive unaltered digital values) and also enable the original unaltered values to be restored. Again, this is of course only a simple example.

It will be appreciated that a corresponding pair of marking sub-ADC units (or associated circuitry) may mark all of the digital values which they produce, or may mark only one or some of them. For example, they may mark digital values only from time-to-time (e.g. during a calibration operation or on startup, or regularly such as every other one). As another example, they may mark digital values dependent on the values of the digital values (e.g. only if they are near full scale as in the above example).

Looking back to FIG. 11, it will be appreciated that the row counters 500 only relate to one of the columns, in this case column C. Thus, in some arrangements the alignment signal of FIG. 11 may only serve to align the operation between the two converter channels for column C0. In other arrangements, when the I-channel row counter 500 for column C0 is reset the corresponding row counters for the other I-channel columns may also be reset by similar reset signals, or the I-channel row counter 500 for column C0 may, when it is reset, itself reset the corresponding row counters for the other I-channel columns. It may thus be that each of the I-channel row counters transmits an alignment signal to its corresponding Q-channel row counter, or that only one of the I-channel row counters (such as the one for column C0 as in FIG. 11) transmits an alignment signal to its corresponding Q-channel row counter, and then that that Q-channel row counter (such as the one for column C0 as in FIG. 11) may, when it is reset, itself reset the corresponding row counters for the other Q-channel columns.

It will be appreciated that the alignment signal of FIG. 11 is transmitted at a particular timing, i.e. when the I-channel row counter 500 is reset, so that they Q-channel row counter 500 can be reset based on that timing. However, if for example, the row counters 500 did not loop (e.g. 0, 1, 2, 3, 0, 1, 2, 3) as in FIG. 11 but instead counted up continually (or to a high enough number), it may be possible for the alignment signal to transmit a current count value from the I-channel row counter 500 to the Q-channel row counter 500. In this way, it may be possible for the Q-channel converter to store its samples and process them after the I-channel converter, but still ensure that corresponding samples are provided to corresponding sub-ADC units in line with FIGS. 10 and 11.

Returning to the digital unit 400 (or subsequent digital circuitry) in FIGS. 9 and 10, it has been explored in connection with FIG. 13 that there may be some unequal delay between the handling of digital values from the I-channel converter and from the Q-channel converter. Thus, such digital circuitry (the digital unit 400 and/or subsequent digital circuitry) may be configured to calculate a delay D (e.g. in numbers of digital values in the series of digital values) between the digital values from the I-channel converter and from the Q-channel converter based on the marking of corresponding digital values, and apply that delay D when handling the digital values from the I-channel converter and from the Q-channel converter.

Figure 14:
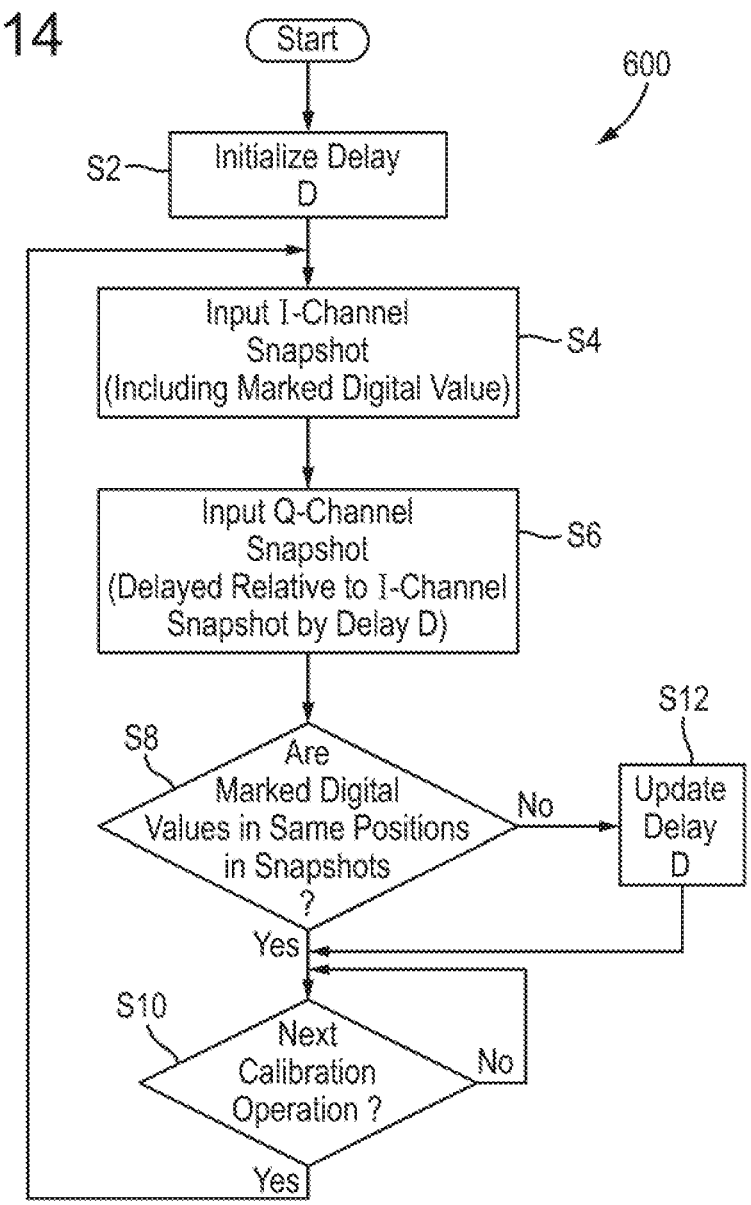
FIG. 14 is a flowchart of an example calibration method which may be employed by digital circuitry operating on the digital values produced by the circuitry of FIG. 9.

FIG. 14 is a flowchart of an example calibration method which may be employed by such digital circuitry, which may be in the form of a processor (executing a computer program) as already mentioned.

Method 600 comprises steps S2 to S12. In step S2 a value of the delay variable D is initialized, for example to a value 0 or to another known value relating to how the digital circuitry operates.

In step S4, a snapshot of the digital values from the I-channel converter (containing a marked digital value) is input to a buffer such as a FIFO buffer or register, and in step S6 a similar snapshot of the digital values from the Q-channel converter, but delayed relative to the I-channel snapshot by delay D, is input to the same or another buffer. Steps S4 and S6 could be performed in the reverse order or in parallel. It will be appreciated that the size of the snapshots may be set (based on an expected range of delays D between the channels) so that if there is a marked digital value in the I-channel snapshot then the corresponding Q-channel marked digital value will be somewhere in the Q-channel snapshot. It may be desirable for the marked digital value in the I-channel snapshot to appear in the middle of its snapshot.

In step S8, it is determined based on the marking applied to the digital values in the snapshots if the marked pair of digital values are in the same positions in their respective snapshots. If they are (S8, YES) the current delay value D is correct and the method proceeds to step S10. If they are not (S8, NO) the current delay value D is incorrect and the method proceeds to step S12, where the current delay value is updated based on the difference between the positions in the snapshots held by the marked pair of digital values. The method then proceeds to step S10.

In step S10 it is determined if a further calibration operation is to be carried out. If a further calibration operation is to be carried out (S10, YES), the method returns to step S4. Otherwise (S10, NO), step S10 repeats until the method 500 is stopped.

It is assumed that the digital circuitry thus processes the digital values from the I-channel converter and from the Q-channel converter (i.e. matches corresponding pairs for operations that need pairs) using the current delay value D and thus matches corresponding pairs of digital values correctly.

Figure 15:
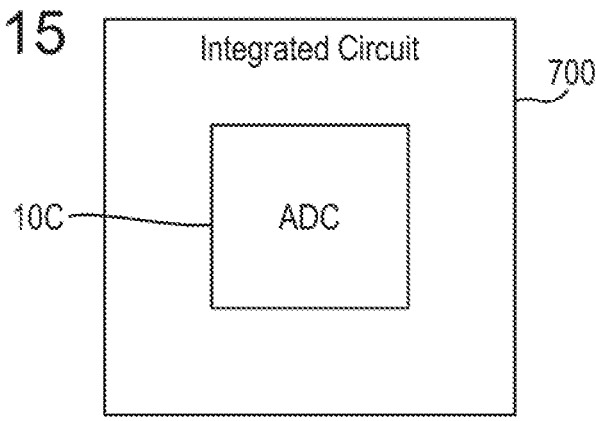
FIG. 15 is a schematic diagram of an integrated circuit 700 embodying the present invention.

FIG. 15 is a schematic diagram of an integrated circuit 700 embodying the present invention. The (semiconductor) integrated circuit 700 comprises the combined ADC circuitry 10C. It will be appreciated that the circuitry disclosed herein could be described as an ADC. Circuitry of the present invention may be implemented as integrated circuitry, for example on an IC chip such as flip chip. Thus, the an integrated circuit 700 may be an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above aspects, the various method features may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an internet website, or it could be in any other form.

The present invention may be embodied in many different ways in the light of the above disclosure, within the spirit and scope of the appended claims.

The invention claimed is:

1. Analogue-to-digital converter (ADC) circuitry, comprising:
a first converter channel operable to receive a first analogue signal and generate a representative first digital signal; and
a second converter channel operable to receive a second analogue signal and generate a representative second digital signal,
wherein each of said converter channels comprises:
sampler circuitry operable to sample the analogue signal concerned and generate therefrom a series of successive samples;
a set of sub-ADC units each operable to convert a sample into a representative digital value; and
control circuitry operable to provide successive samples of said series to successive sub-ADC units for conversion into respective digital values of the digital signal concerned,
wherein:
the series of successive samples generated in the first converter channel corresponds to the series of successive samples generated in the second converter channel, so that each sample generated in the first converter channel has a corresponding sample generated in the second converter channel and so that each digital value generated in the first converter channel has a corresponding digital value generated in the second converter channel;
the control circuitry of the first converter channel is operable to provide successive samples generated in the first converter channel to successive sub-ADC units of the first converter channel in a first order, those sub-ADC units having respective positions in the first order;
the control circuitry of the second converter channel is operable to provide successive samples generated in the second converter channel to successive sub-ADC units of the second converter channel in a second order, those sub-ADC units having respective positions in the second order;
the control circuitry of the first converter channel is configured to transmit an alignment signal to the control circuitry of the second converter channel based on a relationship between the samples generated in the first converter channel and positions in the first order; and
the control circuitry of the second converter channel is configured, based on the alignment signal, to align the positions in the second order with the samples generated in the second converter channel so that when the control circuitry of the first converter channel provides a particular sample generated in the first converter channel to a particular sub-ADC unit of the first converter channel the control circuitry of the second converter channel provides the corresponding sample generated in the second converter channel to a sub-ADC unit of the second converter channel which corresponds to the particular sub-ADC unit of the first converter channel in that it has the same position in the second order as the position of the particular sub-ADC unit in the first order
wherein:
the control circuitry of the first converter channel is configured to transmit the alignment signal to the control circuitry of the second converter channel at a time related to a time when a sample generated in the first converter channel is provided to a sub-ADC unit having a specific position in the first order; and
the control circuitry of the second converter channel is configured, based on a time at which it receives the alignment signal, to align the positions in the second order with the samples generated in the second converter channel.

2. The analogue-to-digital converter circuitry as claimed in claim 1, wherein:
the control circuitry of the first converter channel is configured to transmit the alignment signal to indicate an order in which it provides successive pulses of a clock signal of the first converter channel to successive sub-ADC units of the first converter channel; and
the control circuitry of the second converter channel is configured, based on the alignment signal, to provide successive pulses of a corresponding clock signal of the second converter channel to successive sub-ADC units of the second converter channel in the same order so that corresponding pulses are provided to corresponding sub-ADC units.

3. The analogue-to-digital converter circuitry as claimed in claim 1, wherein the control circuitry of the first converter channel is configured to transmit only one said alignment signal to the control circuitry of the second converter channel during an operation period, and wherein the control circuitry of the second converter channel is configured to align the positions in the second order with the samples generated in the second converter channel based on that alignment signal.

4. The analogue-to-digital converter circuitry as claimed in claim 3, wherein:
the sub-ADC units for each converter channel are organized into rows and columns, the number of rows and columns being the same for both converter channels;

the order of sub-ADC units progresses through the rows and columns in the same way for both converter channels;

the control circuitry of the first converter channel is configured to transmit a said alignment signal per column or for only one of the columns of the first converter channel to the control circuitry of the second converter channel indicating when the sub-ADC unit in a given row of that column is to receive the next sample; and the control circuitry of the second converter channel is configured, based on each of those alignment signals, to align the positions in the second order with the samples generated in the second converter channel in respect of the corresponding column of the second converter channel concerned.

5. The analogue-to-digital converter circuitry as claimed in claim 4, wherein:

the control circuitry of the first converter channel is configured to transmit a said alignment signal for only a given one of the columns of the first converter channel;

the control circuitry of the first converter channel is configured, based on that alignment signal, to align the positions in the first order with the samples generated in the first converter channel in respect of the other columns of the first converter channel; and the control circuitry of the second converter channel is configured, based on that alignment signal, to align the positions in the second order with the samples generated in the second converter in respect of the column of the second converter channel corresponding to the given one of the columns of the first converter channel, and based on that alignment to align the positions in the second order with the samples generated in the second converter channel in respect of the other columns of the second converter channel.

6. The analogue-to-digital converter circuitry as claimed in claim 1, wherein the control circuitry of the first converter channel is configured to transmit a plurality of said alignment signals to the control circuitry of the second converter channel during an operation period, and wherein the control circuitry of the second converter channel is configured to align the positions in the second order with the samples generated in the second converter channel based on those alignment signals.

7. The analogue-to-digital converter circuitry as claimed in claim 1, wherein the sub-ADC units of the first converter channel are configured to operate based upon respective first clock signals and the sub-ADC units of the second converter channel are configured to operate based upon respective second clock signals, the second clock signals corresponding respectively to the first clock signals, and wherein the control circuitry of the second converter channel is configured to align the positions in the second order with the samples generated in the second converter channel by controlling which of the second clock signals are provided to which of the sub-ADC units of the second converter channel.

8. The analogue-to-digital converter circuitry as claimed in claim 1, wherein the first and second converter channels are configured to mark a pair of corresponding digital values to indicate that they correspond to one another based on that pair of digital values having been generated by a pair of corresponding sub-ADC units.

9. The analogue-to-digital converter circuitry as claimed in claim 8, wherein a pair of corresponding sub-ADC units are configured to act as a pair of marking sub-ADC units and are configured to mark one or more digital values that they generate to enable one or more pairs of corresponding digital values to be identified.

10. The analogue-to-digital converter circuitry as claimed in claim 9, wherein each pair of a plurality of pairs of corresponding sub-ADC units are configured to act as a pair of marking sub-ADC units and are configured to mark one or more digital values that they generate to enable pairs of corresponding digital values to be identified.

11. The analogue-to-digital converter circuitry as claimed in claim 9, wherein each pair of corresponding sub-ADC units acting as a pair of marking sub-ADC units are configured to regularly mark digital values that they generate to enable pairs of corresponding digital values to be identified.

12. The analogue-to-digital converter circuitry as claimed in claim 8, wherein the converter channels, or the sub-ADC units concerned of the converter channels, are configured to:

add one or more additional bits only to one or more pairs of corresponding digital values to be marked so as to mark a pair of corresponding digital values; or add one or more additional bits to all of the digital values and to mark a pair of corresponding digital values by setting the value of the one or more additional bits to a marking value.

13. The analogue-to-digital converter circuitry as claimed in claim 12, wherein the converter channels, or the sub-ADC units concerned of the converter channels, are configured to add a plurality additional bits to the digital values, and to mark different pairs of corresponding digital values with different marking values.

14. The analogue-to-digital converter circuitry as claimed in claim 8, comprising:

a digital unit common to the first and second converter channels and configured to receive the digital values from the first and second converter channels as input digital values, process those input digital values and output resultant digital values, wherein the digital unit is operable to identify which input digital values are corresponding digital values based on said marking.

15. The analogue-to-digital converter circuitry as claimed in claim 1, wherein:

the control circuitry of the first converter channel is configured to progress through the respective positions in the first order one to the next in the first order under control by a clock signal of the first converter channel clocking a counter of the first converter channel and starting at a given position in the first order based on a reset signal supplied to that counter;

the control circuitry of the second converter channel is configured to progress through the respective positions in the second order one to the next in the second order under control by a clock signal of the second converter channel clocking a counter of the second converter channel; and the control circuitry of the second converter channel is configured, based on a time at which it receives the alignment signal, to reset the counter of the second converter channel to align the positions in the second order with the samples generated in the second converter channel.

16. Analogue-to-digital converter circuitry, comprising:

a first converter channel operable to receive a first analogue signal and generate a representative first digital signal; and a second converter channel operable to receive a second analogue signal and generate a representative second digital signal, wherein each of said converter channels comprises:

sampler circuitry operable to sample the analogue signal concerned and generate therefrom a series of successive samples;

a set of sub-ADC units each operable to convert a sample into a representative digital value; and control circuitry operable to provide successive samples of said series to successive sub-ADC units for conversion into respective digital values of the digital signal concerned, wherein:

the series of successive samples generated in the first converter channel corresponds to the series of successive samples generated in the second converter channel, so that each sample generated in the first converter channel has a corresponding sample generated in the second converter channel and so that each digital value generated in the first converter channel has a corresponding digital value generated in the second converter channel;

the control circuitry of the first converter channel is operable to provide successive samples generated in the first converter channel to successive sub-ADC units of the first converter channel in a first order, those sub-ADC units having respective positions in the first order;

the control circuitry of the second converter channel is operable to provide successive samples generated in the second converter channel to successive sub-ADC units of the second converter channel in a second order, those sub-ADC units having respective positions in the second order;

the control circuitry of the first converter channel is configured to transmit an alignment signal to the control circuitry of the second converter channel based on a relationship between the samples generated in the first converter channel and positions in the first order; and the control circuitry of the second converter channel is configured, based on the alignment signal, to align the positions in the second order with the samples generated in the second converter channel so that when the control circuitry of the first converter channel provides a particular sample generated in the first converter channel to a particular sub-ADC unit of the first converter channel the control circuitry of the second converter channel provides the corresponding sample generated in the second converter channel to a sub-ADC unit of the second converter channel which corresponds to the particular sub-ADC unit of the first converter channel in that it has the same position in the second order as the position of the particular sub-ADC unit in the first order, wherein the first and second converter channels are configured to mark a pair of corresponding digital values to indicate that they correspond to one another based on that pair of digital values having been generated by a pair of corresponding sub-ADC units.

17. Analogue-to-digital converter circuitry, comprising:

a first converter channel operable to receive a first analogue signal and generate a representative first digital signal; and a second converter channel operable to receive a second analogue signal and generate a representative second digital signal, wherein each of said converter channels comprises:

sampler circuitry operable to sample the analogue signal concerned and generate therefrom a series of successive samples;

a set of sub-ADC units each operable to convert a sample into a representative digital value; and control circuitry operable to provide successive samples of said series to successive sub-ADC units for conversion into respective digital values of the digital signal concerned, wherein:

the series of successive samples generated in the first converter channel corresponds to the series of successive samples generated in the second converter channel, so that each sample generated in the first converter channel has a corresponding sample generated in the second converter channel and so that each digital value generated in the first converter channel has a corresponding digital value generated in the second converter channel;

the control circuitry of the first converter channel is operable to provide successive samples generated in the first converter channel to successive sub-ADC units of the first converter channel in a first order, those sub-ADC units having respective positions in the first order;

the control circuitry of the second converter channel is operable to provide successive samples generated in the second converter channel to successive sub-ADC units of the second converter channel in a second order, those sub-ADC units having respective positions in the second order;

the control circuitry of the first converter channel is configured to transmit an alignment signal to the control circuitry of the second converter channel based on a relationship between the samples generated in the first converter channel and positions in the first order; and the control circuitry of the second converter channel is configured, based on the alignment signal, to align the positions in the second order with the samples generated in the second converter channel so that when the control circuitry of the first converter channel provides a particular sample generated in the first converter channel to a particular sub-ADC unit of the first converter channel the control circuitry of the second converter channel provides the corresponding sample generated in the second converter channel to a sub-ADC unit of the second converter channel which corresponds to the particular sub-ADC unit of the first converter channel in that it has the same position in the second order as the position of the particular sub-ADC unit in the first order wherein:

the control circuitry of the first converter channel is configured to transmit the alignment signal to indicate an order in which it provides successive pulses of a clock signal of the first converter channel to successive sub-ADC units of the first converter channel; and the control circuitry of the second converter channel is configured, based on the alignment signal, to provide successive pulses of a corresponding clock signal of the second converter channel to successive sub-ADC units of the second converter channel in the same order so that corresponding pulses are provided to corresponding sub-ADC units.

* * * * *